(12) United States Patent
Hiraoka et al.

(10) Patent No.: US 6,465,742 B1
(45) Date of Patent: Oct. 15, 2002

(54) THREE DIMENSIONAL STRUCTURE AND METHOD OF MANUFACTURING THE SAME

(75) Inventors: Toshiro Hiraoka, Yokohama; Koji Asakawa, Kawasaki; Yasuyuki Hotta, Toyko, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/651,030

(22) Filed: Aug. 30, 2000

(30) Foreign Application Priority Data

Sep. 16, 1999 (JP) .......................................... 11-262328

(51) Int. Cl.[7] .............................................. H05K 1/03
(52) U.S. Cl. ...................... 174/255; 174/261; 174/262; 174/264; 361/792; 29/830
(58) Field of Search ................................ 174/250, 251, 174/254, 255, 260, 261, 262, 264; 361/792, 795

(56) References Cited

U.S. PATENT DOCUMENTS

| | | | | |
|---|---|---|---|---|
| 5,103,288 A | * | 4/1992 | Sakamoto et al. | 357/71 |
| 5,498,467 A | | 3/1996 | Meola | |
| 5,526,449 A | * | 6/1996 | Meade et al. | 385/14 |
| 5,600,342 A | * | 2/1997 | Pikulski et al. | 343/909 |
| 5,731,073 A | | 3/1998 | Knott et al. | |
| 5,766,979 A | | 6/1998 | Budnaitis et al. | |
| 5,830,565 A | | 11/1998 | Budnaitis et al. | |
| 5,886,413 A | | 3/1999 | Knott et al. | |
| 5,886,535 A | | 3/1999 | Budnaitis et al. | |
| 5,896,038 A | | 4/1999 | Budnaitis et al. | |
| 5,966,022 A | | 10/1999 | Budnaitis et al. | |
| 5,966,593 A | | 10/1999 | Budnaitis et al. | |
| 5,990,850 A | * | 11/1999 | Brown et al. | 343/912 |
| 6,046,076 A | * | 4/2000 | Mitchell et al. | 438/127 |
| 6,114,087 A | * | 9/2000 | Goto et al. | 430/270 |
| 6,177,181 B1 | * | 6/2001 | Hamada et al. | 428/304.4 |
| 6,216,469 B1 | * | 7/2001 | Zakhidov et al. | 216/56 |
| 6,255,601 B1 | * | 7/2001 | Burkhart | 174/262 |

FOREIGN PATENT DOCUMENTS

| | | |
|---|---|---|
| JP | 55-161306 | 12/1980 |
| JP | 7-207450 | 8/1995 |
| JP | 9-160064 | 6/1997 |
| JP | 9-275267 | 10/1997 |
| JP | 9-275268 | 10/1997 |
| JP | 9-283877 | 10/1997 |
| JP | 9-283897 | 10/1997 |
| JP | 9-320463 | 12/1997 |
| JP | 10-209616 | 8/1998 |
| JP | 10-223691 | 8/1998 |
| JP | 10-246751 | 9/1998 |
| JP | 10-294413 | 11/1998 |
| JP | 10-321989 | 12/1998 |
| WO | WO 98/35248 | 8/1998 |

OTHER PUBLICATIONS

Busch et al, *Physcial Review Letters*, vol. 83, No. 5, pp. 967–970 (1999).

Yoshino et al, *Microelectronic Engineering*, vol. 47, pp. 49–53 (1999).

Baughman et al, *International Conference on Thermoelectrics*, pp. 288–293 (1998).

Albalak et al, *Journal of Polymer Science*, (Part B: Polymer Physics) vol. 31, pp. 37–46 (1993).

* cited by examiner

*Primary Examiner*—Kamand Cuneo
*Assistant Examiner*—I B Patel
(74) *Attorney, Agent, or Firm*—Oblon, Spivak, McClelland, Maier & Neustadt, P.C.

(57) ABSTRACT

Disclosed is a three dimensional structure comprising a porous body and a plurality of regions having a substance loaded in the porous body. An average period of a part of the plural regions loaded with the substance is 0.1 to 2 μm to form a photonic band.

19 Claims, 4 Drawing Sheets

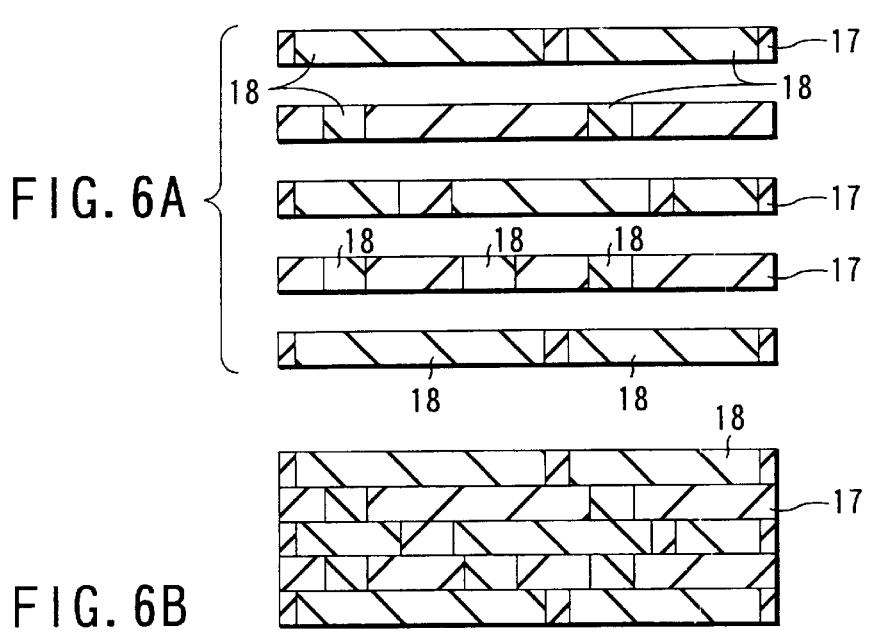
FIG. 6A
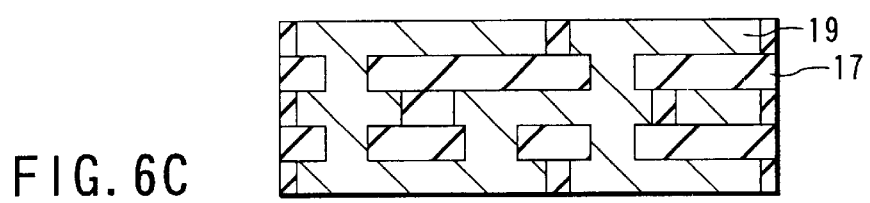
FIG. 6B
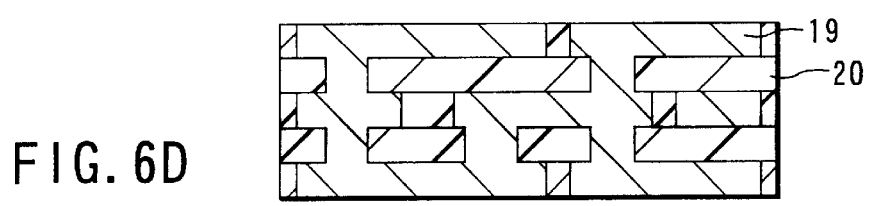
FIG. 6C
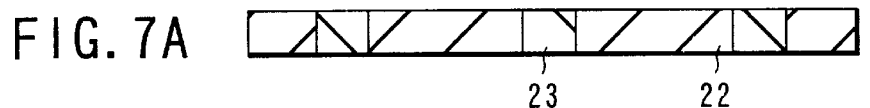
FIG. 6D
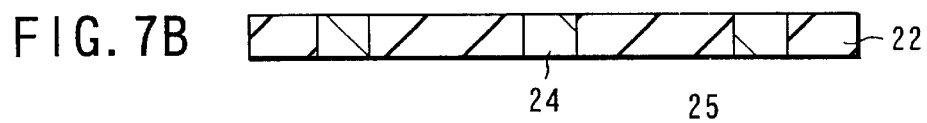
FIG. 7A
FIG. 7B
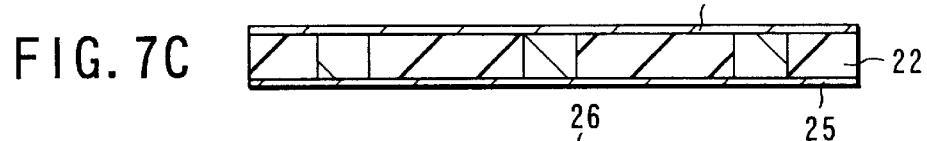
FIG. 7C
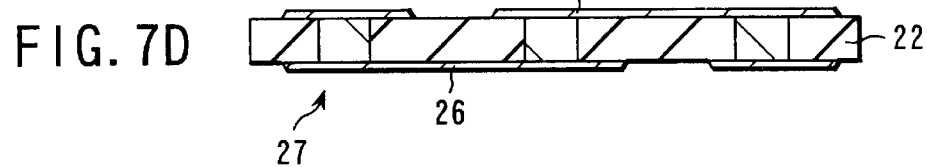
FIG. 7D

ACUTE ANGLE STRUCTURE

OBDD STRUCTURE

GYROID STRUCTURE

THREE DIMENSIONAL STRUCTURE AND METHOD OF MANUFACTURING THE SAME

CROSS-REFERENCE TO RELATED APPLICATIONS

This application is based upon and claims the benefit of priority from the prior Japanese Patent Application No. 11-262328, filed Sep. 16, 1999, the entire contents of which are incorporated herein by reference.

BACKGROUND OF THE INVENTION

The present invention relates to a photonic crystal used in a light functional element, a multi-layer wiring board and a steric wiring board indispensable for a high density mounting in a portable equipment, and a method of manufacturing the same.

A three dimensional structure having a structure of several $\mu$m to hundreds of $\mu$m can be applied to a photonic crystal used in a light functional element such as a branching filter, an optical waveguide, a light delay element or a laser and to a steric wiring used in, for example, a built-up wiring board. In the photonic crystal, a regular periodic structure is required to be formed of substances differing from each other in the refractive index.

A photonic crystal is greatly featured in its optical characteristics. For example, it is possible to produce a wavelength region called photonic band gap, in which the light is not transmitted in any direction (E. Yablonovitch, Phys. Rev. Lett. 58 (20), 2059 (1987)). Also, the photonic crystal exhibits very large optical anisotropy or dispersibility. Therefore, an optical waveguide, a polarizer and a branching filter, which permit controlling the natural light emission and have a very small radius of curvature of a curved corner, have been proposed to date, and it is highly expected for these apparatuses to be put to a practical use.

A three dimensional structure having a distribution of refractive index such as a photonic crystal can be prepared by, for example, a method of laminating beads of silica or a polymer, a method using a self-organized structure such as a polymer, a self-Croning process utilizing a CVD process, a method of three dimensionally dry-etching a semiconductor in three directions, a method of laminating wafers, a method of laminating polycrystalline silicon (polysilicon) layers, a method of forming a distribution of composition of photosensitive agent photopolymerizing a medium consisting of two kinds of photosensitive agents, and a light-shaping process for three dimensionally photo-setting a polymerizable monomer. In each of these methods, the shape that can be formed is limited. For example, in the method of laminating beads or in the method of using a self-organized structure such as a polymer, the three dimensional structure that can be formed is limited. In the case of the self-Croning process, the dry etching method, the wafer fusing method or the polysilicon layer laminating method, a relatively costly semiconductor process is required. In addition, the width of the material selection is narrow. In the method of forming a composition distribution, it is difficult to obtain a large refractive index ratio among regions differing from each other in the refractive index, with the result that the materials used are limited to polymer materials. Similarly, the materials used are limited to polymer materials in the light-shaping process. Also, it is impossible to form isolated regions such as detached territories, making it necessary to form all the regions continuously.

On the other hand, the steric wiring is indispensable to a high density mounting, and various methods are proposed for formation of the steric wiring. In general, these steric wirings are multi-layered structure such as a built-up wiring board prepared by laminating two dimensional printed wiring boards and a multi-layered wiring board. It is difficult to form a steric wiring having a free three dimensional shape. The built-up wiring board or the multi-layered wiring board has a structure that adjacent wiring layers are connected to each other by a conductive column called via. The via is formed by processing a coated insulating layer by a photo-lithography process using a photosensitive polyimide or resist. For forming a via by such a method, it is necessary to repeat a plurality of times the steps of resist coating, light exposure and etching, making the via formation highly laborious. In addition, it is difficult to improve the yield.

It is also possible to form the via by forming a through-hole (via hole) of a predetermined size in an insulating substrate constituting a printed wiring board by using a drill or a $CO_2$ laser, followed by applying plating to the via hole or by filling the via hole with a conductive paste. In these methods, however, it is difficult to form freely a fine via having a size of scores of microns or less at a desired position.

As a method of forming a conductive column without forming a via hole in an insulating substrate, proposed is an anisotropic conductive film prepared by forming a conductive column by an electroless plating in a thickness direction of a three dimensional porous film such as PTFE as disclosed in, for example, Japanese Patent Disclosure (Kokai) No. 55-161306, Japanese Patent Disclosure No. 7-207450, U.S. Pat. No. 5,498,467 and Japanese Patent Disclosure No. 11-25755. In this method, it is possible to form a conductive column extending in the thickness direction of the film without forming a via hole in a predetermined position.

Where the anisotropic conductive film having a conductive column formed therein is used in the via layer of a multi-layered wiring board, not as a single layer anisotropic conductive film, it is necessary to ensure a good electrical and mechanical bonding properties between the via end face and a pat of the wiring, good bonding properties with the wiring layer, in which a wiring is formed, in the insulating layer portion, a high mechanical strength of the insulating layer, and good electrical insulating properties. However, since an open pore is formed within the film, the decrease in the insulating properties caused by the surface conduction on the inner wall of the pore, which is derived from the moisture absorption, is brought about as a problem in the case of using the film in the via layer (i.e., an insulating substrate having a via formed therein) of the multi-layered wiring substrate. Also, it is impossible to ensure a sufficiently high mechanical strength. In the conventional technology pointed out above, the porous film is impregnated after the via formation with, for example, a thermosetting resin to make the porous portion solid so as to ensure the required adhesivity. However, if the resin is impregnated after the via formation, the end face of the via is covered with the thermosetting resin, leading to a poor connection and an increased contact resistance. For removing the resin layer covering the end face of the via, a troublesome extra step is required.

Also proposed is a method of forming an anisotropic conductive sheet in which the via portion alone is porous and the portion other than the via portion is in the form of a solid film. In this method, a predetermined region of a polysilane sheet is exposed so as to bring about photo-oxidation and, thus, to convert the exposed portion into polysiloxane, thereby making the sheet porous. Then, the porous portion is loaded with a conductive substance by, for example, a plating technology so as to form a conductive column. In this technology, the insulating material used is limited to polysilane. It should be noted that polysilane tends to be deteriorated by an acidic substance, by an oxidizing reaction, etc. Also, polysilane does not exhibit an adhesivity in general. Therefore, in the case of using an anisotropic conductive sheet formed of polysilane as a via layer of a multi-layered board, an adhesive layer for bonding adjacent layers is newly required. What should be noted is that the end face of the via tends to be covered with the new adhesive layer.

A porous film prepared by elongating a uniform film such as PTFE is used as a three dimensional porous film in which a wiring or a via is formed. Particularly, where the film is made porous by elongation, an irregular three dimensional structure including relatively large knot-like structures and a fibrous structure mutually connecting these knot-like structures tends to be formed. The porous film consisting of such an irregular three dimensional structure tends to be nonuniformly shrunk within a film plane by the change in temperature and by the dipping in a solvent, making it difficult to maintain a high dimensional accuracy. Also, even if a conductive pattern is formed by exposure, the exposing ray is scattered by the nonuniform structure, making it difficult to form a satisfactory exposure pattern. Further, in the conductive column formed in such a porous film, a continuous phase of the conductive material within the pore is formed in an irregular shape, resulting in failure to obtain a sufficient conductance. In order to allow the conductive column to exhibit a satisfactory conductivity, it is necessary for the conductive material such as copper, which is loaded in the pore, to be loaded within the pore continuously with a high loading rate. For achieving such a loading state, it is necessary for the pores of the three dimensional porous film to have a regular shape and to be uniform in the pore diameter. It is also necessary for the three dimensional porous film not to include an obstacle structure such as a knot-like structure and for the pores to be formed homogeneously within the film.

In general, a multi-layered board is prepared by forming a conductive layer consisting of, for example, copper on each surface of an insulating sheet having a via formed therein, followed by patterning the conductive layer to obtain a double-sided wiring board having an electric circuit formed on each surface and subsequently laminating a plurality of such double-sided wiring boards. In this case, however, the surface of the insulating sheet is made irregular because the wiring portion having a certain thickness is selectively formed on the surface of the insulating sheet. The irregularity formed between the wiring portion and the non-wiring portion gives rise to a problem when the double-sided wiring boards are laminated one upon the other. The problem is serious particular where the insulating layer is formed thin, making it necessary to flatten the irregularity by some means. As a means for flattening the irregularity, a prepreg impregnated with a thermosetting resin is used in general as an insulating sheet, and the thermosetting resin is loaded in the irregularity in the laminating step. In this method, however, it is necessary to make the insulating sheet sufficiently thicker than the wiring layer so as to make it difficult to decrease sufficiently the thickness of the insulating sheet. Where the insulating sheet is thick, it is impossible to make the aspect ratio of the via (i.e., a ratio of the height to the diameter of the via) sufficiently large and, thus, the via diameter cannot be diminished. It follows that it is also impossible to diminish the wiring pitch and, thus, it is difficult to form a fine wiring pattern.

Further, where a multi-layered board is prepared, a conductive layer made of, for example, copper is formed first, on a via layer having a via. Then, the conductive layer is patterned to form a wiring and, thus, a via layer and a wiring layer, followed by laminating the wiring layers so as to prepare a multi-layered board. What should be noted is that required is a successive process such that a circuit is formed after formation of the via layer. It is impossible to collectively laminate wiring layers and via layers formed separately because it is very difficult to form independently a wiring layer without using an insulating substrate requiring a via formation and to hold and transfer the independent wiring layer for lamination.

A technique for overcoming the above-noted problem is disclosed in Japanese Patent Disclosure No. 10-321989. Specifically, it is disclosed that a circuit is formed on a honeycomb-like porous sheet such as a mesh-like screen or a punching sheet such that the screen is enclosed by the circuit. According to this technique, the circuit is held by the mesh, and the conductive portion of the circuit is exposed to the outside, making it possible to form a multi-layered structure as it is. However, since the screen is in the form of a plain weave of a fiber, it is relatively difficult to ensure the stability of the shape and the size. Also, since it is necessary to increase the fiber diameter to scores of $\mu$m in order to ensure a sufficient mechanical strength, the technique disclosed in the prior art quoted above is not adapted for formation of a fine circuit wiring not larger than about scores of quoted above is not adapted for formation of a fine circuit wiring not larger than about scores of $\mu$m. Further, in the case of using a honeycomb-like sheet, it is necessary to form a conductive layer on each of the upper and lower surfaces of the sheet in order to achieve conduction in the lateral direction. The formation of the conductive layer naturally gives rise to irregularity. In order to eliminate the irregularity of the wiring, it is necessary to form an insulating layer substantially equal in thickness to the wiring in the non-conductive portion, too. Also proposed in, for example, Japanese Patent Disclosure No. 55-161306 is a technique of forming a striped conductive region in a three dimensional porous film. However, the laminate structure of such a three dimensional porous film is not disclosed nor suggested in the prior art.

In the method of preparing a multi-layered wiring board by laminating a plurality of sheets each having a wiring pattern or a via formed therein, the positional deviation in the laminating step gives rise to a problem. The tendency is rendered prominent as the fineness of the wiring proceeds. Particularly, in the case of laminating the three dimensional porous film described above, the position aligning accuracy is not high because the three dimensional porous film is inferior to an ordinary solid film in the dimensional accuracy, mechanical strength, etc.

As described above, in forming a three dimensional structure having the refractive index distributed in a three dimensional direction such as a photonic crystal, the conventional method was defective in that the shape formed is limited and that it was impossible to obtain a large difference in the refractive index. Also, the width of selection of the materials was small in the conventional method.

Where a multi-layered wiring board is used in forming a steric wiring, troublesome steps are required in laminating sheets each having a wiring formed therein or in forming a via. Also, in the case of using a sheet having a conductive column formed in a porous film, the mechanical strength and electric insulating properties tend to be lowered because the sheet is porous. It is certainly possible to improve the mechanical strength and the electrical insulating properties by impregnating the porous sheet having a conductive column formed therein with resin. In this case, however, the end face of the conductive column is covered with the impregnated resin so as to lower the electrical characteristics. Further, it is difficult to decrease the thickness of the wiring board because it is necessary to flatten the irregularity of the wiring in forming the multi-layered board. Therefore, it was impossible to diminish the via diameter, resulting in failure to form a fine wiring. Also, the manufacturing process is rendered troublesome because it is necessary to form a circuit on an insulating sheet having a via formed therein. Where a multi-layered wiring board is prepared by laminating a plurality of sheets, it is difficult to align the sheets accurately, giving rise to the problem that it is difficult to make the wiring and the via fine.

As described above, it was difficult to manufacture easily with a low cost a photonic crystal having the crystal structure changed in various fashions by the combination of substances sufficiently differing from each other in the refractive index. Also, in the multi-layered wiring board, it was impossible to form a fine via freely and with a high accuracy and to form in the board in a desired pattern a steric wiring arranged in a three dimensional direction.

BRIEF SUMMARY OF THE INVENTION

An object of the present invention is to provide a three dimensional structure having a three dimensional refractive index, wherein the three dimensional structure has a large difference of refractive index.

Another object of the present invention is to provide a three dimensional structure used suitably as a multi-layered wiring board or a steric wiring board having a high degree of freedom in the circuit design and having a fine wiring.

Another object of the present invention is to provide a three dimensional structure having a fine wiring and a via and excellent in electrical characteristics.

Further, still another object of the present invention is to provide a method of manufacturing the particular three dimensional structure.

According to a first aspect of the present invention, there is provided a three dimensional structure, comprising: a porous body; and a plurality of regions formed in the porous body and loaded with a substance; wherein an average period of a part of said plural regions loaded with said substance is 0.1 to 2 $\mu$m to form a photonic band.

In the three dimensional structure of the present invention, the region for forming the photonic band is supported by a porous body, making it possible to obtain a photonic crystal having a stable shape and, thus, it is possible to select freely the material that is loaded in the photonic band-forming region or the region other than the photonic band-forming region. As a result, it is possible to increase the change in the refractive index in the photonic band-forming region, making it possible to obtain a satisfactory photonic crystal having a large change in the refractive index, as desired.

According to a second aspect of the present invention, there is provided a method of manufacturing a three dimensional structure, comprising a porous body and a plurality of regions formed in the porous body and loaded with a substance, an average period of a part of said plural regions loaded with said substance being 0.1 to 2 $\mu$m to form a photonic band, comprising the steps of: loading a photosensitive material in the pore of the porous body; selectively exposing a predetermined region of the porous body loaded with said photosensitive material; and selectively removing the photosensitive material in the exposed portion or non-exposed portion of the porous body after the exposure.

In the method of the present invention for manufacturing a three dimensional structure, the region for forming a photonic band is supported by a porous body, making it possible to obtain a photonic crystal having a stable shape. Therefore, the periodic arrangement of the particular regions can be set freely. In addition, since it is possible to select freely the material that is loaded in the photonic band-forming region or the region other than the photonic band-forming region, it is possible to increase the change in the refractive index. It follows that a good photonic crystal can be formed at a low cost.

According to a third aspect of the present invention, there is provided a three dimensional structure, comprising a porous body, and a three dimensional wiring pattern formed by a conductive material loaded in the porous body, wherein said three dimensional wiring pattern includes at least three first layers each having a two dimensional wiring pattern and arranged in a direction perpendicular to the plane of the two dimensional wiring pattern, and at least two second layers interposed between two adjacent first layers and having joining portions for joining the two dimensional wiring pattern of the first wiring layer interposed between these two second layers.

In the three dimensional structure of the present invention, the three dimensional wiring pattern is formed of a conductive material loaded in a porous body having through-holes continuous in a three dimensional direction. Thus, since the wiring is supported by the porous body, a difficulty such as a peeling is unlikely to take place. Also, the present invention has made it possible to obtain a three dimensional structure having a three dimensional free shape and a steric wiring of a high density and adapted for use as a three dimensional wiring structure. In addition, since the porous body used in the present invention differs from the type of a plain weave of a fiber such as a mesh-like screen, it is possible to ensure stability in the shape and size of the three dimensional structure.

According to a fourth aspect of the present invention, there is provided a three dimensional structure, comprising a sheet-like first porous body having a two dimensional wiring pattern formed therein, and a sheet-like second porous body laminated on and made integral with said first porous body, wherein said second porous body has a joining portion connected to the two dimensional wiring pattern formed in said first porous body, and the first and second porous bodies have through-holes.

In the three dimensional structure of the present invention, the two dimensional wiring pattern is supported by the sheet-like first porous body and, thus, is unlikely to incur difficulties such as peeling. Also, the present invention has made it possible for the first time to form a fine wiring pattern and a via with a high dimensional accuracy. In addition, such a fine wiring pattern and a via can be formed easily. Such a three dimensional structure is adapted for use as a three dimensional wiring structure.

According to a fifth aspect of the present invention, there is provided a method of manufacturing a three dimensional structure, comprising the steps of selectively exposing a porous body to beam in a three dimensional wiring pattern having a plurality of two dimensional patterns in the incident direction of the beam, and selectively loading a conductive material or a precursor thereof in the pores in the exposed portion or non-exposed portion of the porous body after the exposure.

In the method of the present invention for manufacturing a three dimensional structure, a three dimensional exposure is employed, with the result that a positional deviation as in the conventional multi-layered wiring prepared by laminating a plurality of sheets does not take place at all. Further, a defective connection between the wiring and the via does not take place at all. It follows that the method of the present invention makes it possible to manufacture easily a fine and complex steric wiring structure.

Further, according to a sixth aspect of the present invention, there is provided a three dimensional structure, comprising a porous structure formed by a micro phase-separation structure and a conductive region formed by loading a conductive material in a predetermined region of the porous body, wherein said porous body is formed by removing at least one kind of the phase constituting a micro phase separation structure.

In the porous body formed by the micro phase separation structure included in the three dimensional structure of the present invention, the pores are formed homogeneously and regularly. In addition, the continuity of the pores is satisfactory. As a result, the dimensional stability is excellent and the conductance of the conductive region can be improved, compared with the case of using a conventional porous body prepared by, for example, elongation. Also, since it is possible to form pores of submicron order homogeneously, it is possible to form a fine wiring and a fine via. Further, since the width and thickness of the conductive region can be made uniform, the impedance characteristics are improved. What should also be noted is that, since the light scattering can be diminished in the exposure step, a fine pattern can be formed with a high accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6D are cross sectional views collectively showing another method of the present invention for manufacturing a three dimensional wiring structure; and FIGS. 7A to 7D are cross sectional views collectively exemplifying a method of the present invention for manufacturing a selective conductive member.

FIG. 8 illustrates an ordered bicontinuous double diamond structure (OBDD).

DETAILED DESCRIPTION OF THE INVENTION

Figure 1:
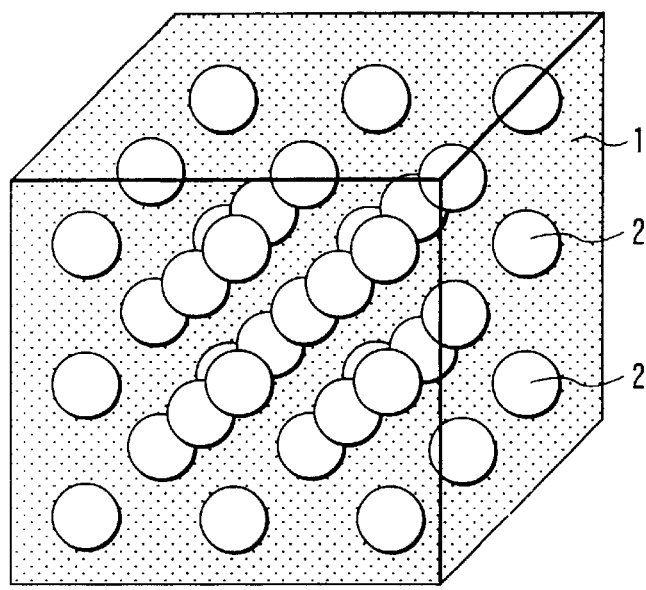
FIG. 1 schematically exemplifies a three dimensional structure of the present invention.

The present invention will now be described in detail.

A three dimensional structure according to a first embodiment of the present invention can be manufactured by using a porous body having pores continuous to each other in a three dimensional direction. The porous body used in the present invention differs from a honeycomb-like sheet which has pores extending only one direction. More specifically, the porous body has pores extending any directions in space.

It is desirable for the continuous pore present in the porous body to be formed regularly and homogeneously because the light is unlikely to be scattered. It is necessary for the continuous pore in the porous body used in the present invention to be open to the outside of the porous body, and it is desirable for the amount of the closed pore that is not open to the outside to be as small as possible. Also, in order to enlarge the difference in refractive index within the photonic crystal, it is desirable for the porosity to be high as far as the mechanical strength of the porous body can be maintained. To be more specific, the porosity should desirably be at least 40% and, more desirably, at least 60%. The upper limit of the porosity, which is not particularly limited in the present invention as far as the structure of the porous body can be maintained, is generally about 99%.

In the method of the present invention, the inner region of the porous body is exposed. Thus, in order to avoid the scattering of light, it is desirable for the diameter of the pore to be sufficiently small relative to the wavelength of the exposing light. Also, where a photonic crystal is manufactured, it is necessary for the pore diameter to be set sufficiently smaller than the wavelength of the signal light in order to prevent the signal light from being scattered. However, if the pore diameter is excessively small, it is difficult to load the photosensitive material in the pore. Further, the photosensitive material in the exposed portion or the non-exposed portion is unlikely to be removed by, for example, the etching technique. Under the circumstances, the pore diameter of the porous body should desirably fall within a range of between 1 nm and 100 nm, more desirably between 5 nm and 50 nm, and most desirably between 10 nm and 30 nm.

The porous body consisting of a co-continuous structure having open pores formed to extend in a three dimensional direction can be manufactured by various methods. For example, the porous body can be manufactured by laminating beads of silica, a polymer, etc. The laminate body of the particular construction includes a synthetic opal, which is a laminate body of silica beads, and a green sheet, which is an aggregate of fine ceramic particles. It is also possible to use the porous body reported by, for example, Y. A. Vlasov et al. (Adv. Mater, 11, No. 2, 165, 1999), and S. A. Johnson et al. (Science Vol. 283, 963, 1999). These porous bodies are manufactured by loading resin or a metal oxide gel in the voids of the laminate body of beads, followed by curing the loaded material and subsequently removing the beads. Further, it is also possible to use a porous structure of a polymer prepared by using a laminate body of air bubbles or liquid bubbles in place of the beads as a mold, as reported by, for example, S. H. Park et al. (Adv. Mater. 10, No. 13, 1045, 1998) or S. A. Jenekhe et al. (Science Vol. 283, 372, 1999). Also, it is desirable to use a silica aerogel, which has a porosity of at least 90% and a pore diameter of about 100 nm or less and obtained by subjecting a silica sol to a supercritical drying, because the silica aerogel has a high porosity and is excellent in transparency.

It is also possible to use a porous body formed by removing a suitable phase from a micro phase separation structure exhibited by, for example, a polymer or a phase separation structure such as a co-continuous phase separation structure formed by spinodal decomposition of a mixture containing a polymer, silica, a ceramic material, etc. It is also possible to use a porous body such as a metal oxide or a polymer prepared by an emulsion templating method. Further, it is possible to use a porous body prepared by a three dimensional light-shaping method, as reported by, for example, B. H. Cumpston et al. (Nature, vol. 398, 51, 1999).

Particularly, it is desirable to use a porous structure of, for example, a polymer prepared by using a laminate body of air bubbles or liquid bubbles as a mold because a porous body having regular pores at a high porosity can be obtained at a low cost. It is also desirable for the similar reason to use a porous body prepared by removing a suitable phase from a phase separation structure exhibited by, for example, a polymer. Incidentally, it is most desirable to manufacture a porous body from a phase separation structure of a polymer because the pore diameter can be controlled easily. The phase separation structure of the polymer is not particularly limited and includes, for example, a phase separation structure formed by a spinodal decomposition exhibited by a polymer blend and a micro phase separation structure exhibited by a block copolymer or a graft copolymer. The micro phase separation structure exhibited by the block copolymer or graft copolymer is excellent because the particular micro phase separation structure is highly regular and the magnitude of the domain can be controlled by the molecular weight of the copolymer.

Particularly, the co-continuous structure among the micro phase separation phenomenon is a phase separation structure consisting of two phases continuous to each other in a three dimensional direction, and a porous body having pores continuous in a three dimensional direction can be formed by selectively removing one phase. An OBDD structure and Gyroid structure are desirable among the co-continuous structure. The method of selectively removing one phase from the micro phase separation structure is not particularly limited, and various methods can be employed for the selective removal of one phase. For example, it is possible to employ a method of chemically cutting coupling portion by using graft copolymer or block copolymer coupling two terekeric polymers, followed by removing one of the terekeric polymer. It is also possible to employ a method of decomposing and removing one phase by selective ozone oxidation and a removing method by an oxygen plasma or a photolytic degradation. It is also possible to selectively decompose and remove one phase by irradiation with an energy beam. The pore diameter of the resultant porous body can be controlled by the molecular weight of the polymer chain constituting the phase that is to be removed from the micro phase separation structure. The pore diameter can also be controlled by mixing, for example, a homopolymer compatible with such a polymer chain.

The polymer materials used for preparing the porous body from the phase separation structure are not particularly limited, and an optional polymer material can be used. Specifically, the polymer materials used include, for example, a polyolefin, an acryl-series polymer, a polyether such as polyally ether, a polyester such as polyallylate, a polyamide, a polyimide and a polyether sulfone. It is also possible to use polycyclohexane or polynorbornene.

In the method of the present invention for manufacturing a three dimensional structure, a photosensitive material is loaded first in the pores of the porous material having continuous pores described above. The photosensitive material used includes, for example, a composition comprising a thermosetting resin such as an acryl-series resin monomer and, preferably, a two-photon absorptive photo-setting catalyst. Such a photosensitive material can be loaded in the pores of the porous body by allowing the porous body to be impregnated with such a photosensitive composition as it is or a solution of such a photosensitive material or by employing a CVD method and so on.

The porous body having the photosensitive material loaded in the pores is exposed in a three dimensional direction in such a manner that a periodic structure pattern forming a photonic band. In general, a source such as a visible light or an ultraviolet ray can be used for the exposure in addition to β-rays (electron beams), an X-ray, etc. It is most desirable to use a visible light or an ultraviolet ray because the exposure step is simple. However, it is also desirable to use β-rays (electron beams) that exhibit a good penetrating capability in a thickness direction of the film.

In performing a exposure in a three dimensional direction, it is possible to employ the technique of, for example, scanning the focus on which a laser beam or the like is collected by a lens in a three dimensional direction within the porous body. It is also possible to allow two laser beams, i.e., a linear laser beam and a sheet-like laser beam, to be incident within the porous body and to scan the intersection of these two beams in a three dimensional direction. Alternatively, it is possible to form an interference fringe within the porous body. In other words, it suffices to allow a plurality of collimated beams to be incident and to interfere with each other within the porous body so as to form an interference pattern.

After the exposure, the photosensitive material in the exposed portion or non-exposed portion is selectively removed. In removing the photosensitive material within a predetermined region, it is possible to employ a wet developing method such as washing with a solvent, a gaseous phase etching such as an oxygen plasma etching, or a method of thermal development in which an undesired portion is evaporated by heating. By removing the photosensitive material in the predetermined region, it is possible to form a region in which the photosensitive material remains unremoved and a region from which the photosensitive material has been removed so as to be made porous, said unremoved region and the removed region differing from each other in the refractive index. Since various materials can be selected as the photosensitive material as far as the material can be loaded in the pores, it is possible to change freely and enlarge the difference in the refractive index. It is possible to load another second material in the porous portion from which the photosensitive material has been removed. Alternatively, it is possible not to fill the pores completely with the photosensitive material so as to leave voids and to load the voids with, for example, a metal by a plating treatment. In this case, the difference in the refractive index can be further enlarged.

In the three dimensional structure of the present invention, a plurality region is formed within the porous body by loading a material, and the regions are arranged at an average period of 0.1 to 2 $\mu$m to form a photonic band. The three dimensional structure of the present invention is used in a region ranging between a visible light region and a near infrared region. In the present invention, it is necessary for the region in which the porous body is loaded with a material to have a portion having an average period of 0.1 to 2 μm in view of the wavelength of the light noted above.

FIG. 1 schematically exemplifies the construction of a three dimensional structure of the present invention. In the structure called photonic crystal, the relationship between the wavenumber and the frequency, i.e., photon energy, of light exhibits a band structure because of the periodic change in the refractive index as the energy of electrons within a semiconductor exhibits a band structure because of the periodic change in potential. As shown the FIG. 1, plurality region 2 loaded a material is formed in a porous body 1, and the regions are arranged periodically in such a manner that photonic band is formed. That is to say, regions 2 constitute a photonic crystal. Incidentally, it is desirable for the period of the region in which the porous body is loaded with a material to be about half the wavelength of the light to be used. For example, if the period is 0.3 μm, the wavelength of the light used is 0.6 μm, which is double the period of 0.3 μm, making it possible to form a photonic band of a visible region. It is unnecessary to use a band edge having the lowest energy, and it is possible to use a band edge having a high energy.

The materials loaded in the regions that are arranged periodically need not be particularly limited to various polymers, the ceramic materials such as metal oxides, and metals. It is possible for the loaded material to be a liquid crystal or a nonlinear optical material. Since the difference in the refractive index between the loaded region and the non-loaded region should desirably be large, it is desirable for the loaded material to have a large refractive index. To be more specific, metal oxides such as titanium oxide and alumina and a composite material between an ultra fine particle of these metal oxides and a polymer are used as the loaded materials. The portion except the periodically arranged regions can be left as a porous portion having voids. Alternatively, it is possible to load the portion except the periodically arranged regions with another material such as a light modulating material like a liquid crystal or a material capable of emitting a laser beam. Also, it is possible to impart a temperature adjusting device such as a piezo-electric element, a heater or a Peltier element, an electrode for applying an electric field, or a light emitting element for light irradiation to the three dimensional structure of the present invention in order to distort the periodic structure and to modulate the photonic band characteristics.

Figure 2:
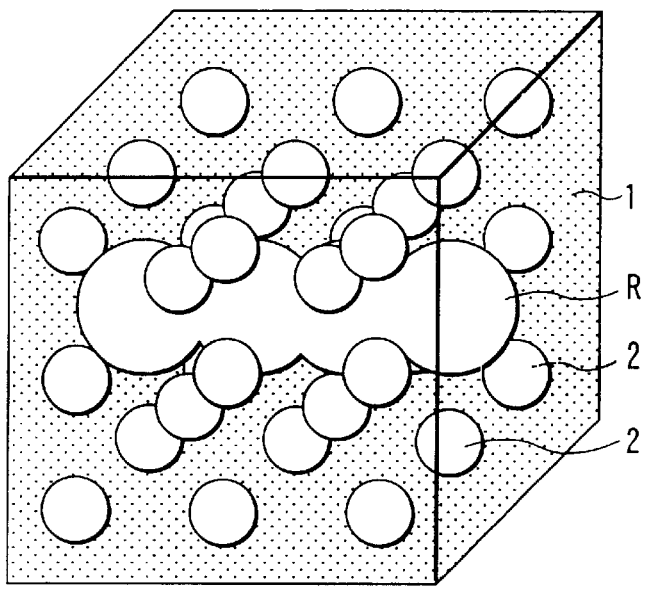
FIG. 2 schematically shows another example of the three dimensional structure of the present invention.

In the three dimensional structure of the present invention manufactured as described above, since the porous structure supports regions constituting the photonic crystal, and it is possible to keep the structure, the arrangement of the periodic regions can be set freely. In addition, since the material to be loaded in the periodic regions or the region other than the periodic regions can be selected freely, it is possible to enlarge the change in the refractive index. It follows that it is possible to form a satisfactory photonic crystal. Also, size stability against to a change to the passage to time or a temperature change is satisfactory. Also, if disturbances are formed within the periodic structure of the photonic crystal and these disturbances are contiguous to each other in a one dimensional direction, the photonic crystal can be used as an optical waveguide. The disturbance of the periodic structure can be formed by removing a part of the periodically present regions or by arranging a region R other than the periodically arranged region 2 in the porous body, as shown in FIG. 2. Further, it is possible to form by the similar technique an optical waveguide portion for allowing a signal light to be incident on or to be emitted from the photonic crystal. To be more specific, the photonic crystal is selectively exposed in a pattern of an optical waveguide to form a core portion acting as an optical waveguide and a clad portion. Typically, an optical waveguide can be obtained by forming, for example, a region in which an acrylic resin monomer is linearly loaded within the porous portion. In this case, it is possible to form a GI type optical waveguide by using a mixture of a plurality of different kinds of acrylic resin monomers. An improvement of efficiency and miniaturization can be made possible by forming an optical waveguide of a signal light in the photonic crystal as described above. Also, it is possible to modulate the photonic band by forming a portion having a changed refractive index in addition to the group of periodically arranged regions forming a photonic band. Such a region for disturbing the periodic structure functions like an impurity level in a semiconductor. As a result, it is possible to form a region through which the light having a predetermined wavelength can be transmitted within the photonic band gap. For example, it is possible to manufacture a photonic crystal laser having small oscillation loss by doping a laser colorant in the three dimensional structure of the present invention so as to align the impurity level with the oscillation wavelength region of the laser colorant.

A three dimensional structure according to a second embodiment of the present invention will now be described. The three dimensional structure according to the second embodiment of the present invention can be called a three dimensional wiring structure.

The three dimensional wiring structure of the present invention can be manufactured by the method of the present invention by using a porous body having uniformly formed through-holes that are continuous in a three dimensional direction. The porous body used in the present invention differs from a honeycomb-like sheet which has through-holes extending only one direction. More specifically, the porous body has through-holes extending any directions in space.

It is desirable for the continuous pore present in the porous body to be formed regularly and homogeneously because such a porous body is unlikely to scatter the light. It is necessary for the continuous pore in the porous body used in the present invention to be open to the outside of the porous body, and it is also desirable for the number of closed pores that are not open to the outside of the porous body to be as small as possible. Also, in order to improve the dielectric constant of the wiring, it is desirable for the porosity to be high as far as the mechanical strength of the porous body can be maintained. To be more specific, the porosity should desirably be at least 40%, and more desirably at least 60%. The upper limit of the porosity, which is not particularly limited in the present invention as far as the structure of the porous body can be maintained, is generally about 99%.

In the present invention, the inner region of the porous body is exposed. Thus, in order to avoid the scattering of the light, it is desirable for the pore diameter to be sufficiently small, compared with the wavelength of the light used for the exposure. It should be noted, however, that, if the pore diameter is excessively small, it is difficult to load the pore with a metal by the plating technique or the like. Particularly, in the case of forming a wiring, it is necessary for the loaded metal to be continuous sufficiently within the pores. If the pore diameter is unduly small, the metal, even if introduced into the pores by the plating technique, tends to be in the form of fine particles that are separated from each other within the pore. In order to avoid such an inconvenience, it is desirable for the pore diameter in the porous body used in the present invention to fall within a range of between 30 nm and 2000 nm, more preferably between 50 nm and 1000 nm, and most preferably between 100 nm and 500 nm.

Even where the pore diameter fails to fall within the range noted above and is larger than the wavelength of the light used for the exposure, it is possible to prevent the scattering of the light in the step of the exposure, if a liquid material having a refractive index close or equal to that of the porous body is loaded in the pores for preventing the scattering of the light. However, if the pore diameter is excessively large, it is difficult to load the metal sufficiently within the pore by the plating technique or the like and it is also difficult to diminish sufficiently the wiring width to scores of $\mu$m or less. Also, short-circuiting tends to take place between adjacent layers in the case of manufacturing a multi-layered wiring board. Under the circumstances, it is desirable for the pore diameter of the porous body to be set at 5 $\mu$m or less even in the case of using a liquid material for preventing the light scattering in the exposure step.

A co-continuous porous body having open pores formed in a three dimensional direction can be prepared by various methods as already described in conjunction with the manufacture of the three dimensional structure. For example, it is possible to use a porous body prepared by laminating beads, a porous body formed of a green sheet, a porous body prepared by using a laminated structure of beads as a mold, a porous body prepared by using a laminate body of air bubbles or liquid bubbles as a mold, a porous body prepared from a co-continuous structure generated by the spinodal decomposition of a mixture containing a polymer, silica, etc., a porous body prepared by an emulsion templating method, and a porous body prepared by a three dimensional light-shaping method.

Particularly, it is desirable to use a porous structure of, for example, a polymer prepared by using a laminate body of air bubbles or liquid bubbles as a mold because a porous body having regularly arranged pores and a high porosity can be prepared at a low manufacturing cost. A porous body prepared by removing a suitable phase from a phase separation structure exhibited by a polymer is also desirable by the similar reason. Incidentally, it is most desirable to manufacture a porous body from a phase separation structure of a polymer because the pore diameter can be easily controlled and the manufacturing cost can be decreased. The phase separation structure of the polymer is not particularly limited in the present invention. For example, the phase separation structure of the polymer used in the present invention includes a phase separation structure formed by spinodal decomposition exhibited by a polymer blend and a micro phase separation structure exhibited by a block copolymer or a graft copolymer. It is most desirable to use a micro phase separation structure exhibited by a block copolymer or a graft copolymer because it is possible to form a regular porous structure having pores whose diameter can be controlled easily. A co-continuous structure is desirable as the micro phase structure. Particularly desirable are, for example, an OBDD structure and a Gyroid structure. For forming a co-continuous structure, it is desirable to set the weight fraction of the polymer chain constituting the porous body in the polymer to fall within a range of between 30% and 70%.

It is possible to control the pore diameter of the resultant porous body by the molecular weight of the polymer chain constituting the phase removed from the phase separation structure. It is also possible to control the pore diameter of the porous body by mixing a homopolymer compatible with such a polymer chain. Although it is difficult to form a porous body having a pore diameter not smaller than 100 nm by using a copolymer alone, a porous body having such a pore diameter can be prepared relatively easily by employing the technique of mixing a homopolymer.

Where a porous body is used as a substrate for the wiring formation, it is desirable to use an insulating metal oxide or a polymer for forming a porous body. Particularly, it is desirable to use a heat-resistant polymer such as polyimide, polyamide, polyaryl ether, polyarylate, and polyether sulfone. Also, it is possible to use a polymer prepared by crosslinking a polymer having a double bond in the side chain or backbone chain and prepared by polymerizing conjugated diene monomers of a 1,2-bond type or a 1,4-bond type such as polybutadiene. It is also possible to use polycyclohexane and polynorbornene.

A porous body of polyimide can be prepared, for example, as follows. In the first step, a polyamic acid, which is a precursor of polyimide, is mixed with a thermally decomposable polymer such as polyethylene oxide, polypropylene oxide, or poly(methyl methacrylate). In this step, it is possible to perform a phase separation as a block copolymer or a graft copolymer. Then, a heat treatment is applied so as to convert the polyamic acid into polyimide and, at the same time, to remove the thermally decomposable polymer by evaporation.

It is desirable to use a block copolymer or a graft copolymer in view of the regularity of the structure. It should be noted, however, that, in the case of forming pores having a size of at least 100 nm, it is relatively difficult to synthesize a block copolymer because the molecular weight of the thermally decomposable polymer chain exceeds about 100,000. Therefore, it is desirable to introduce a coupling group to, for example, the terminal of the thermally decomposable polymer chain, followed by synthesizing a graft copolymer.

To be more specific, in the case of synthesizing a graft copolymer between, for example, a polyamic acid and a thermally decomposable polymer such as polyethylene oxide or polypropylene oxide, it is possible to employ the technique described below. Specifically, an amino group is introduced first into the terminal of a thermally decomposable polymer chain as a coupling group that is chemically bonded with a side chain of a polyamic acid such as a carboxyl group. Then, a graft copolymer is synthesized by mixing the thermally decomposable polymer having the coupling group introduced thereinto and a polyamic acid. Also, it is possible to control the pore diameter of the porous body by adding a homopolymer to the block copolymer or graft copolymer. If a crosslinkable plasticizer such as bis-maleimides are added in this step, the formation of the micro phase separation structure is promoted and the heat resistance and the mechanical strength of the porous body are improved.

It should be noted that 1,2-bonding type polybutadiene, i.e., poly(vinylethylene), is crosslinked in a three dimensional direction by the addition of a radical generator or a crosslinking agent so as to form a cured polymer excellent in heat resistance, electrical characteristics, humidity resistance, and mechanical characteristics. In addition, since poly(vinylethylene) is capable of living polymerization, it is possible to obtain a block copolymer having a high molecular weight and uniform in molecular weight distribution. It follows that, in the case of using a block copolymer between poly(vinylethylene) and a poly(methacrylic acid ester) that can be decomposed and removed by irradiation with β-ray or a thermally decomposable polyethylene oxide or polypropylene oxide, it is possible to form a regular porous body consisting of a crosslinked poly(vinylethylene) having a desired pore diameter. It is possible to control the pore diameter of the porous body by adding a homopolymer in this case, too.

The radical generating agent used in the present invention includes, for example, organic peroxides such as dicumyl peroxide and azonitriles such as azobis-isobutyronitrile. Particularly, it is desirable to use polyfunctional radical generating agents such as 2,2-bis(4,4-di-t-butyl peroxy cyclohexyl)propane, 3,3',4,4,'-tetra(t-butyl peroxy carbonyl) benzophenone because the polyfunctional radical generating agent also acts as a crosslinking agent. It is desirable to add the radical generating agent in an amount of 0.1 to 20% by weight, more preferably 1 to 5% by weight, based on the polymer chain to be crosslinked. If the amount of the radical generating agent is unduly small, the density of crosslinkage is rendered low. On the other hand, if the amount of the radical generating agent is excessively large, the crosslinked material is rendered porous or the micro phase separation structure is disturbed.

It is desirable to use as the crosslinking agent bis-maleimides such as bis(4-maleimide phenyl) methane, bis(4-maleimide phenyl) ether, 2,2'-bis[4-(para-aminophenoxy)phenyl]propane and 2,2'-bis[4-(para-aminophenoxy)phenyl]hexafluoropropane. The addition amount should fall within a range of between 0.1 and 20% by weight, preferably between 1 and 5% by weight, based on the polymer chain to be crosslinked. If the addition amount of the crosslinking agent is unduly small, the density of the crosslinkage is low. If the addition amount is excessively large, however, the micro phase separation structure is disturbed.

If the crosslinking reaction proceeds before formation of the micro phase separation structure, the formation of the micro phase separation structure is impaired. Thus, it is desirable for the crosslinking reaction to be started after sufficient formation of the micro phase separation structure. Formation of the micro phase separation structure proceeds under temperatures higher than the glass transition temperature of each polymer chain forming a copolymer. Thus, it is desirable for the glass transition temperature of the polymer chain to be sufficiently lower than the radical generation temperature of the radical generating agent.

An example of the most preferred composition is a composition prepared by adding 2,2-bis(4,4-di-t-butyl peroxy cyclohexyl)propane or 3,3',4,4'-tetra(t-butyl peroxy carbonyl)benzophenone to a diblock copolymer or a triblock copolymer among poly(vinylethylene) chain and polyethylene oxide chain or polypropylene oxide chain in an amount of 1 to 5% by weight based on the poly(vinylethylene) chain. Particularly, it is most desirable to use 3,3',4,4'-tetra(t-butyl peroxy carbonyl)benzophenone as the radical generating agent.

Poly(vinylethylene) has a glass transition temperature of about 20° C. Also, polyethylene oxide or polypropylene oxide has a sufficiently low glass transition temperature of about 0° C. or lower. On the other hand, the thermal decomposition initiating temperatures of 2,2-bis(4,4-di-t-butyl peroxy cyclohexyl) propane and 3,3', 4,4'-tetra(t-butyl peroxy carbonyl) benzophenone are 139° C. and 125° C., respectively, which are sufficiently high, when heated at a heating rate of 4° C./min. Therefore, it is desirable to form a micro phase separation structure by heating from room temperature to about 50° C., followed by gradually heating the composition to a temperature close to the thermal decomposition temperature of the radical generating agent so as to achieve crosslinking and curing. It should be noted, however, that, if the composition is heated to an unduly high temperature, the order-disorder transition temperature is exceeded before achieving a sufficient crosslinkage, resulting in melting to form a homogeneous composition. In this sense, 3,3',4,4'-tetra (t-butyl peroxy carbonyl) benzophenone is desirable because radicals are generated by irradiation with an ultraviolet ray without relying on the thermal decomposition.

As described above, 2,2-bis(4,4-di-t-butyl peroxy cyclohexyl)propane or 3,3',4,4'-tetra(t-butyl peroxy carbonyl)benzophenone is added to a diblock copolymer or a triblock copolymer among poly(vinylethylene) chain and poly(methyl methacrylate) chain in an amount of 1 to 5% by weight based on the poly(vinylethylene) chain. In this case, poly(methyl methacrylate) has a relatively high glass transition temperature of about 105° C. Thus, a crosslinking reaction is likely to take place before the micro phase separation structure is formed sufficiently. It follows that poly(methyl methacrylate), if irradiated with β-rays, tends to be thermally decomposed and evaporated, making it possible to form a porous structure by the washing with a solvent or by the heat treatment at a relatively low temperature. Since the glass transition temperature of poly(methyl methacrylate) is close to the cross linking initiating temperature of poly(methyl methacrylate), it is desirable to form the micro phase separation structure by slowly evaporating the solvent from the solution to form a cast film. In this case, formation of the micro phase separation structure is not impaired by the crosslinking if the evaporation of the solvent is performed at a temperature sufficiently lower than the thermal decomposition temperature of the radical generating agent. However, such a method of forming a cast film takes a relatively long time and, thus, the productivity is not sufficiently high. This is also the case with the use of polya (methyl styrene) in place of poly(methyl methacrylate).

In the case of using poly(methacrylic acid ester) in which an alkyl group having 3 to 6 carbon atoms is substituted or poly(a-methyl styrenes) in which such an alkyl group is substituted for the phenyl group in place of poly(methyl methacrylate) or poly(α-methyl styrene), the glass transition temperature is lowered, making it possible to avoid the above-noted problem. To be more specific, a micro phase separation structure can be formed promptly by applying a heat treatment to the copolymer film (or a molded body) at a temperature higher than the glass transition temperature. For example, poly(n-propyl methacrylate) and poly(n-butyl methacrylate) have low glass transition temperatures, i.e., 35° C. and 25° C., respectively. Poly(α-methyl styrene) having the 4-position butylated also exhibits a low glass transition temperature. The glass transition temperature can be further lowered if the alkyl group has at least 6 carbon atoms. However, at the same time, a crosslinking reaction tends to take place easily upon irradiation with β-rays. The polymers satisfying both the low glass transition temperature and the promotion of the decomposition by irradiation with β-rays include, for example, poly(n-propyl methacrylate), poly(n-butyl methacrylate) and poly(s-butyl methacrylate). Particularly, it is most desirable to use poly (n-butyl methacrylate) and poly(s-butyl methacrylate).

Where the alkyl group is branched like 2-ethyl hexyl group, the effect of promoting the decomposition by irradiation with β-rays is unlikely to be suppressed and, thus, it is desirable to use a branched alkyl group. However, the poly(methacrylate) having a branched alkyl group is inferior in the practical use to poly(n-butyl methacrylate) and poly (s-butyl methacrylate) because it is difficult to obtain monomers of polymethacrylate having a branched alkyl group.

It is also possible to use polyisobutylene and polypropylene in addition to the polymers described above as a polymer chain satisfying both the low glass transition temperature and the effect of promoting decomposition by irradiation with β-rays.

The irradiation amount of the β-rays, which is not particularly limited in the present invention, should fall within a range of between 100 Gy and 10 MGy, preferably between 1 KGy and 1 MGy, and most preferably between 10 KGy and 200 KGy. If the irradiation amount is unduly small, it is difficult to decompose sufficiently the decomposable polymer chain. On the other hand, if the irradiation amount is excessively large, the decomposed product of the decomposable polymer chain tends to be crosslinked in a three dimensional direction so as to be cured. Further, the polymer chain, which is unlikely to be decomposed, tends to be decomposed. The accelerating voltage, which is dependent on the thickness of the molded body of the copolymer, i.e., the penetration length of the β-rays into the molded body, should desirably fall within a range of between about 20 kV and 2 MV when it comes to a thin film having a thickness of about scores of $\mu$m or less and should desirably fall within a range of between about 500 kV and 10 MV when it comes to a molded body such as a film or bulk having a thickness of at least 100 $\mu$m. Where a metal molded body is contained in the molded body, it is possible to further increase the accelerating voltage.

In the case of employing the irradiation with β-rays, poly(vinylethylene) chain is crosslinked and, thus, it is possible to decrease the amount of the radical generating agent, or it is possible not to add at all the radical generating agent. In this case, it is not absolutely necessary to lower the glass transition temperature. Crosslinked poly (vinylethylene) exhibits excellent characteristics and, thus, it is attempted to use the crosslinked poly(vinylethylene) in a wiring board, though the crosslinked polymer is not satisfactory in the adhesivity to copper used as a wiring material. However, the difficulty can be avoided in the present invention because the wiring and the via consisting of copper is formed integral with the porous body in the present invention.

A three dimensional structure of a metal or a metal oxide, which can be used as a multi-wiring board or a 3D wiring, can be formed by the method of the present invention for manufacturing a three dimensional wiring structure. It is also possible to form a three dimensional structure such as carbon or diamond by employing the method of the present invention for manufacturing a three dimensional wiring structure. Such a structure can also be used as a photonic crystal. In the case of manufacturing a photonic crystal, the pore diameter of the porous body used should desirably fall within a range of between 10 nm and 500 nm, more desirably between 20 nm and 100 nm, and most desirably between 30 nm and 50 nm. A structure of a metal oxide or carbon can be used as a capacitor or resistor within the three dimensional wiring structure.

In manufacturing a three dimensional wiring structure of the present invention, a porous structure having a continuous through-holes described above is selectively exposed to form a latent image of a three dimensional pattern. The three dimensional pattern noted above implies a pattern having a plurality of two dimensional patterns differing from each other in respect of the incident direction of the light. As the source for the exposure, it is possible to use β-rays (electron beams), an X-ray, etc. in addition to the sources such as an ordinary visible light or an ultraviolet ray. It is most desirable to use a visible light or an ultraviolet ray because the exposure process is simple. However, it is also desirable to use β-rays having good penetrating properties in the thickness direction of the film.

The exposure in a three dimensional direction can be performed by scanning in a three dimensional direction the focus on which rays are converged by a lens or the like. Alternatively, it is possible to apply selectively exposure to the intersection of two beams. It is possible for at least one of these two beams to be a sheet-like beam. In the case of such a three dimensional exposure, it is possible for the photosensitive material on the inner surface of the pore to absorb two photons and to exhibit a nonlinear sensitivity relative to the intensity of irradiation. Alternatively, it is possible for the photosensitive material to exhibit a sensitivity when irradiated simultaneously with rays having two different wavelengths.

By applying the three dimensional exposure, the inner surface of the pore within the region exposed is chemically modified. A metal or a metal oxide is allowed to precipitate and grow about the chemically modified portion acting as a nucleus so as to permit the grown metal or metal oxide to be loaded in the inner space of the pore. Since a metal or a metal oxide is loaded selectively in the exposed portion, a three dimensional structure of the metal or metal oxide can be formed within the porous body by applying the exposure in a three dimensional direction. In this case, if the precipitation is started from a portion close to the surface of the porous body, the precipitated metal or the like closes the pore so as to inhibit the precipitation deep inside the porous body. Such being the situation, it is desirable to make the exposure amount deep inside the porous body larger than that on the portion close to the surface of the porous body so as to permit the precipitation of the metal or the like to be started from a region deep inside the porous body.

The inner surface of the pore that is modified by the exposure can be the surface to which is exposed the member constituting the porous body. Alternatively, a surface coated with a suitable coating agent can be the surface that is modified by the exposure. The surface is not particularly limited, as far as the surface member is modified by the exposure so as to act as a catalyst nucleus in the step of precipitating a metal or a metal oxide.

For example, where a polyimide film surface wet with an aqueous solution of copper sulfate is irradiated with, for example, an ArF laser beam, the copper atoms are taken into the surface of the polyimide film. The copper atoms act as a catalyst nucleus so as to permit copper or the like to be selectively precipitated on the irradiated portion by an electroless plating. Alternatively, where a polyimide porous body is dipped in advance in an aqueous solution of copper sulfate, followed by applying a three dimensional exposure to the porous body, it is possible to form a three dimensional wiring structure made of copper within the polyimide porous body by the similar principle.

Also, it is possible to form a three dimensional wiring structure within a porous body by the technique described below. Specifically, the inner surface of the pore of the porous body is coated by absorption or the like with a material forming a catalyst of an electroless plating, followed by applying a three dimensional exposure to the porous body. Then, the catalyst in the non-exposed portion is selectively removed, followed by applying an electroless plating so as to obtain a three dimensional wiring structure. Acetylacetonate complexes of many metals, which are capable of sublimation, are decomposed upon irradiation with an ultraviolet ray so as to lose their capability of sublimation. After the inner surface of the pore is coated with a compound of such a complex compound, a three dimensional exposure is applied to the porous body, followed by applying a heat treatment within, preferably, vacuum. As a result, the complex compound within the non-exposed portion can be selectively removed so as to leave within the exposed portion the photolytic degradation material of the complex compound providing a catalyst nucleus of the plating.

If the surface of the porous body is photosensitive and a bonding group capable of bonding with the material providing a catalyst nucleus is formed, it is possible to allow the material providing the catalyst nucleus to be selectively adsorbed on the exposed portion. For example, if a fluorine-containing resin such as PTFE is irradiated with an excimer laser such as an ArF laser in the presence of, for example, water, the surface of the irradiated portion can be made hydrophilic. It is possible to carry out a selective plating by such a photochemical surface modification.

Where the inner surface of the pore is formed of titania, it is possible to allow a catalyst material to be adsorbed in a predetermined region by making the exposed portion hydrophilic. Also, where an organic material is attached to the titania surface, it is possible to allow a catalyst material to be adsorbed in a predetermined region by decomposing the organic material. For example, where the exposed portion is made hydrophilic, a catalyst material, if hydrophilic, can be selectively adsorbed in the exposed portion. On the other hand, where the catalyst material is hydrophobic, the catalyst material can be selectively adsorbed in the non-exposed portion. It is also possible to arrange the catalyst selectively in the exposed portion or in the non-exposed portion by decomposing the substance adsorbed on the titania layer so as to change the sublimation capability and dissolution capability. Where the catalyst is adsorbed after the exposure, the catalyst can be selectively adsorbed in the non-exposed portion if the material adsorbed on the titania layer is capable of adsorbing the catalyst. On the other hand, if the catalyst consists of a material that can be adsorbed selectively on the surface of the titania layer, the catalyst can be selectively adsorbed in the exposed portion.

It should also be noted that, for example, polysilane is capable of reducing a noble metal compound into the noble metal upon contact with the noble metal compound so as to precipitate noble metal fine particles providing a nucleus of plating. However, if subjected to photo-oxidation by exposure to, for example, an ultraviolet ray, polysilane fails to bring about such a reaction. It follows that, if the porous body is formed of polysilane or the inner surface of the pore is coated with polysilane, it is possible to permit precipitation of a metal selectively in the exposed portion alone by an electroless plating.

After the catalyst region is formed by selectively arranging catalyst nuclei in the exposed portion or non-exposed portion of the porous body as described above, a metal, a metal oxide, carbon, diamond, or the like is grown within the catalyst region so as to load the grown material within the pore. In loading such a material within the pore, it is possible to employ, for example, a plating method such as an electroless plating or a CVD method. Since the porous body has pores continuous in a three dimensional direction and open to the outside of the porous body, a plating liquid or reactant gases can be smoothly introduced into the catalyst region formed in the exposed region or the non-exposed region. Also, since the material loaded in the continuous pore such as a metal, a metal oxide, carbon or diamond forms a continuous body and, thus, the loaded material such as a metal performs a satisfactory function as a wiring.

In the method of the present invention for manufacturing a three dimensional wiring structure, the surface of the pore of the porous material is exposed so as to be chemically modified, and a catalyst nucleus for the plating or CVD is selectively arranged. It suffices for the photosensitive material that is chemically modified upon exposure to be exposed to the inner surface of the pore. In other words, the entire porous material need not be formed of the photosensitive material. By contraries, where the porous body has a strong absorption in the wavelength of the light used for the exposure, it is difficult to expose the inner region of the porous body. Therefore, it is desirable for the porous body to be formed of a material that does not have an absorption in the wavelength of the light used for the exposure and for the inner surface alone of the pore to be coated with a thin photosensitive material layer. It is most desirable for the photosensitive material to be adsorbed on the inner surface of the pore in the form of a monomolecular layer.

It is possible to form a three dimensional wiring by applying a three dimensional exposure to a porous medium, followed by dipping the porous medium in an electroless plating bath so as to selectively precipitate a metal in the exposed portion or the non-exposed portion. It is possible for the metal wiring to be precipitated in any of the exposed portion or the non-exposed portion.

As described above, a fine complex wiring structure can be manufactured easily by employing the method of the present invention for manufacturing a three dimensional wiring structure without giving rise to a positional deviation or a poor connection between the wiring and the via which take place in the conventional multi-layered wiring prepared by laminating a plurality of sheets.

Figure 3:
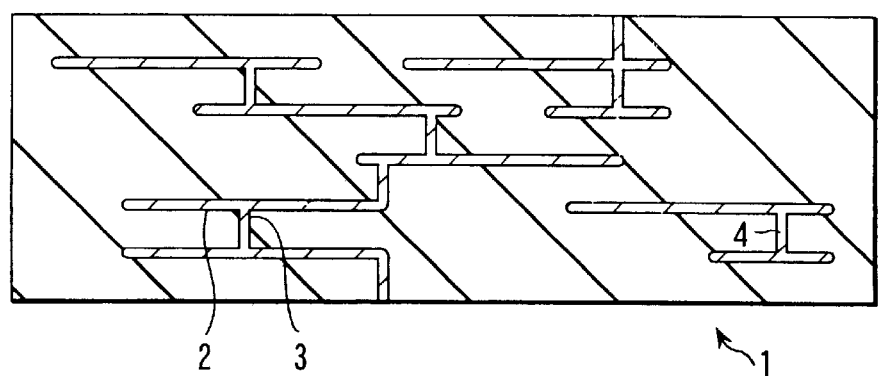
FIG. 3 is a cross sectional view exemplifying a three dimensional wiring structure of the present invention.

In the three dimensional wiring structure of the present invention, a multi-layered wiring structure is formed in a porous body having pores continuous to each other in a three dimensional direction. FIG. 3 is a cross sectional view exemplifying a three dimensional wiring structure 4 of the present invention.

In the three dimensional wiring structure 4 shown in FIG. 3, a plurality of two dimensional wirings 2 are formed within a porous body 1. As shown in the drawing, two adjacent two dimensional wirings 2 are connected to each other by a via 3. It is desirable for the continuous pore of the porous body to be loaded with an impregnated resin consisting of a thermosetting resin such as an epoxy resin, polyimide, BT resin, benzocyclobutene resin, or a crosslinked polybutadiene resin. If the continuous pore is left to be a continuous void, the inner surface of the pore absorbs moisture so as to deteriorate the electrical insulating properties. The materials loaded in the pore are not particularly limited. It is possible to use, for example, resin and an inorganic material such as silica formed from silsesquioxane or polysilazane as a material to be loaded in the pore. However, it is most desirable to use an impregnated resin in view of the loading capability, adhesivity, etc. It is more desirable for the impregnated resin to contain in some cases an inorganic filler of an nanometer order. The inorganic filler used in the present invention includes fine particles of, for example, a metal oxide such as silica or alumina, a metal nitride such as silicon nitride or aluminum nitride, and a metal such as platinum or palladium. The inorganic filler is mixed with the impregnated resin to form a mixture and impregnated. Alternatively, it is possible to perform impregnation of a mixture of an inorganic filler precursor and an impregnated resin, followed by forming an inorganic filler within the pore. Silsequioxane or polysilazane is used satisfactorily as the inorganic filler precursor.

Figure 4A:
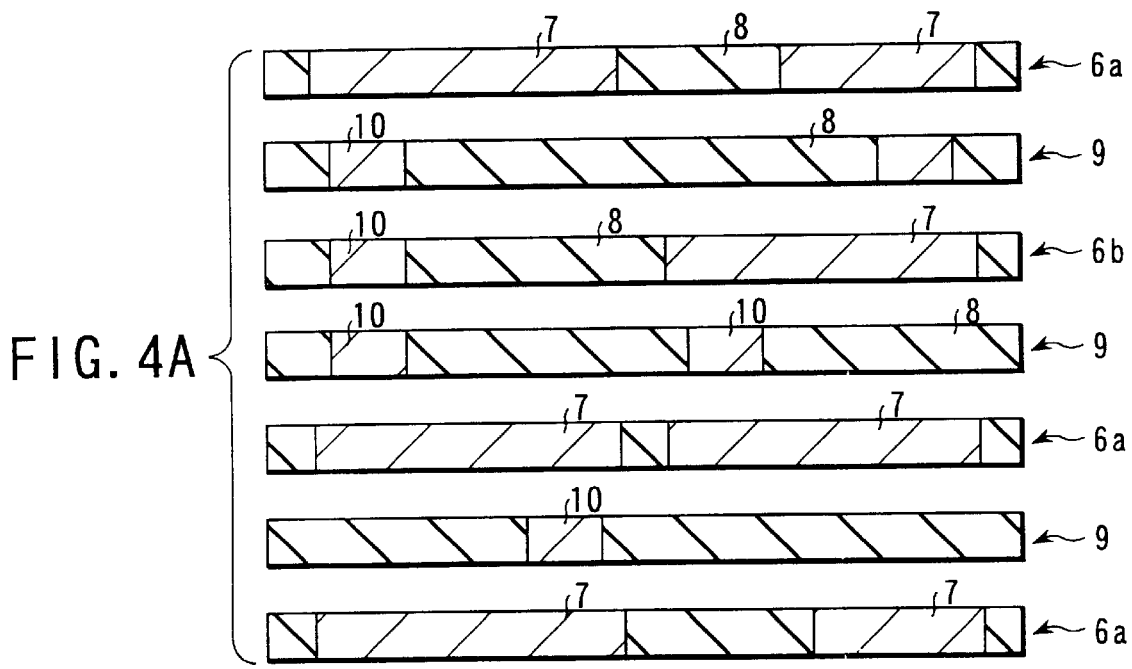
FIGS. 4A and 4B are cross sectional views collectively exemplifying a method of the present invention for manufacturing a three dimensional wiring structure.

The three dimensional wiring structure of the present invention can also be manufactured by a method other than the method of the three dimensional exposure described above. For example, a sheet-like porous body is selectively exposed to, preferably, a parallel light flux in a two dimensional circuit pattern, followed by applying an electroless plating as described previously to form a wiring of a circuit pattern having a certain thickness in the thickness direction within the porous body, thereby forming wiring sheets 6a and 6b as shown in FIG. 4A. Each of these wiring sheets 6a and 6b is made of a porous body 8, and a wiring pattern 7 is formed in a predetermined region of the porous body 8. In some cases, it is possible to form a via 10 in the same sheet as the wiring pattern 7 like the wiring sheet 6b. Further, a via sheet 9 is formed by the same method, except that a via pattern is exposed. It is desirable for end face of the via of the via sheet 9 to have a sharp angle like a sharp mountain so as to facilitate the connection between the via and the wiring. It is also possible to coat the end face of the via with solder. The via should desirably have a sharp end face in this case, too, for the reason described above. Where the end face of the via is flat, the end face tends to be covered with the impregnated resin, with the result that the electrical connection tends to be impaired. The sharp mountain-like structure can be formed by applying a needle-like plating of, for example, a Cu/Ni eutectic system. It is also desirable to coat the end face with, for example, gold, silver, platinum or solder. It is more desirable to form an acute angle structure in this case, too. If the end face of the via is flat, the end face tends to be covered with the impregnated resin so as to impair the electrical connection. The sharp mountain-like structure can be formed by applying a needle-like plating of a Cu/Ni eutectic system, as reported by, for example, Fujinami et al. (Theses for $5^{th}$ Meeting of Academic Speeches, 1999, Printed Circuit Institute, pp. 109–110). It is also possible to use nickel for forming the via of the via sheet and to use copper for forming the wiring of the wiring sheet. In this case, since nickel is harder than copper, the nickel via bites into the copper wiring in the step of laminating the via sheet and the wiring sheet one upon the other so as to achieve a satisfactory connection. A three dimensional wiring structure 11 having a three dimensional wiring 12 formed therein can be obtained by alternately laminating the wiring sheets 6a, 6b and the via sheet 9 one upon the other as shown in FIG. 4B.

The wiring sheets 6a, 6b and the via sheet 9 can be laminated by compression. In performing the compression, it is possible to insert an adhesive layer between adjacent sheets. Further, if an impregnated resin such as epoxy resin, polyimide, BT resin or benzocyclobutene resin is loaded in the porous body after the compression step and, then, cured, it is possible to obtain a stronger multi-layered wiring board. By using the particular technique, an inner via can be formed very easily. Also, the difference in level between the wiring portion and the non-wiring portion can be made very small or can be eliminated by forming the wiring within the film of the porous body so as to achieve lamination very easily. It is also possible to decrease the thickness of the layer and increase the number of laminated layers. These effects are rendered prominent particularly where the thickness of the film of the porous body is made as thin as several μm. Further, since the wiring sheet and the via sheet can be prepared basically in the same process step, the manufacturing process can be simplified.

Figure 4B:
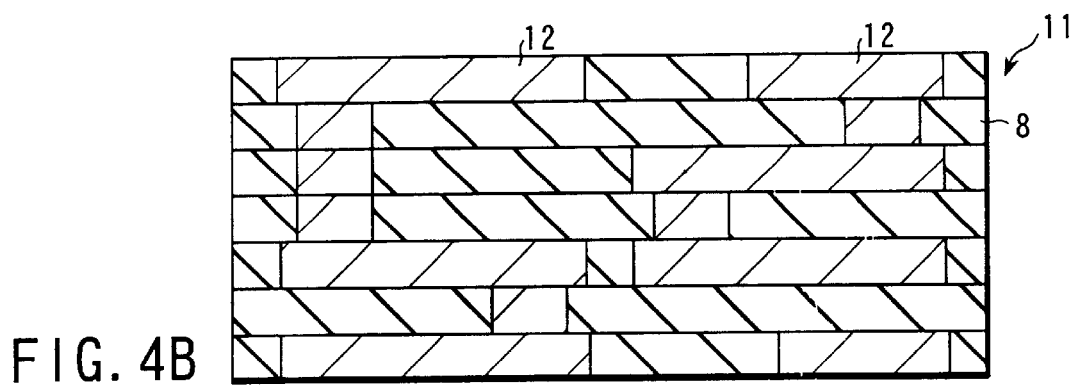
Figure 5:
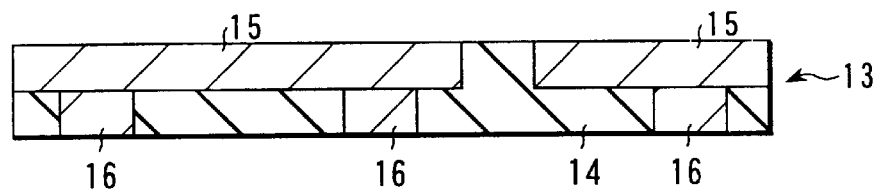
FIG. 5 is a cross sectional view showing another example of the three dimensional wiring structure of the present invention.
Figure 8:
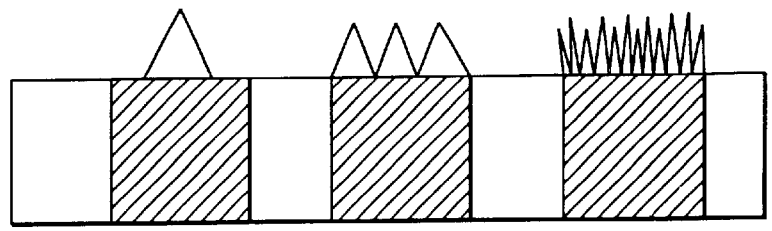
FIG. 8 illustrates an acute angle structure.
Figure 9:
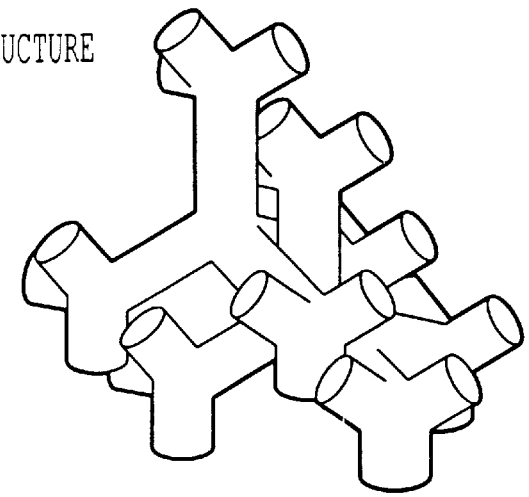
Figure 10:
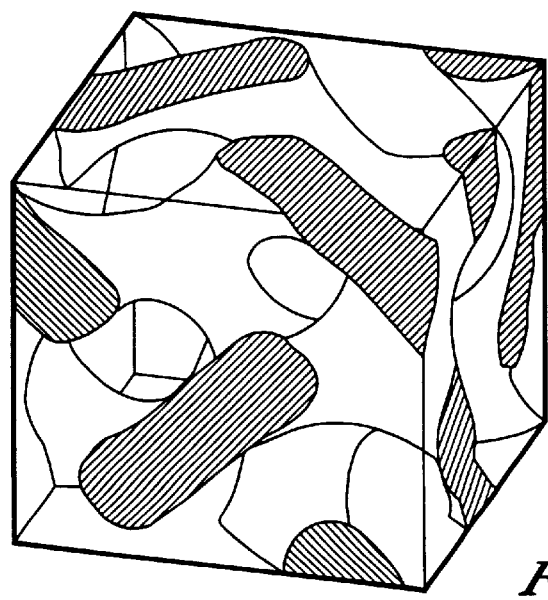
FIG. 10 illustrates a Gyroid structure.

In the example shown in FIG. 4B, the wiring sheet and the via sheet are prepared separately. However, it is possible to prepare the wiring and the via simultaneously in a single porous sheet. That is to say, the number of laminating layers can be decreased by forming the wiring pattern 15 and the via pattern 16 in a single sheet as shown in FIG. 5 so as to simplify the manufacturing process. For example, the absorbance of the porous body sheet relative to the wavelength of the beam used for exposure is adjusted so as to allow the penetrating length of the beam for the exposure (or an energy beam such as β-rays) to be about half the thickness of the sheet. In this case, the wiring pattern is exposed from one surface of the porous body sheet, and the via portion is exposed from the other surface. Then, an electroless plating is applied so as to obtain a three dimensional wiring structure 13 having a wiring pattern 15 and a via pattern 16, as shown in FIG. 5.

Also, in manufacturing a wiring sheet having each layer of a circuit pattern formed therein, it is possible to use a porous body sheet having a photosensitive resin composition such as resist loaded in the pore. In this case, a porous body sheet is selectively exposed in a circuit pattern, followed by removing the resist in the portion of forming a wiring so as to make the sheet selectively porous. Then, an electroless plating or the like is applied so as to load a metal in the porous portion, thereby forming a wiring. Incidentally, the metal loading for forming the wiring can be performed by an electrolytic plating by arranging an appropriate electrode. After formation of a via sheet by the similar technique, wiring sheets and via sheets are alternately laminated one upon the other so as to obtain a three dimensional wiring structure (multi-layered wiring board) as shown in FIG. 4B. It is also possible to manufacture a built-up board by laminating such a wiring sheet and a via sheet on a core substrate.

In the case of employing the method described above, it is desirable to use a photosensitive polyimide or a photosensitive epoxy resin as a photosensitive resin composition because the photosensitive composition need not be removed after formation of the wiring and the photosensitive composition also acts as an adhesive in the compression step.

A plurality of wiring sheets used for manufacturing a multi-layered wiring board can be laminated collectively. Alternatively, it is possible to manufacture a multi-layered wiring by repeating the process of superposing a porous sheet having a wiring not yet formed therein on a wiring sheet, followed by applying an exposure and plating.

It is also possible to manufacture a three dimensional wiring structure by the procedures shown in FIGS. 6A to 6D. Specifically, in the first step, a porous body sheet 17 forming each layer is selectively exposed to form a latent image 18 consisting of, for example, a catalyst nucleus for an electroless plating, as shown in FIG. 6A. Then, the porous body sheets 17 are laminated one upon the other, as shown in FIG. 6B, followed by collectively applying an electroless plating so as to form a wiring pattern 19 as shown in FIG. 6C. It is possible to impregnate the porous body sheet with an epoxy resin or polyimide 20, as required, followed by applying heating so as to cure the resin 20 and, thus, to prepare an integral structure, as shown in FIG. 6D. The resin impregnation after lamination as described above is desirable because the electrical connection between the laminated sheets can be improved. In this case, it is desirable to form the ground layer 21 as a wiring pattern because the formation of the ground layer 21 serves to decrease the electromagnetic noise within the inner wiring layer.

As described above, fine via and wiring are formed freely and accurately in the three dimensional wiring structure of the present invention. It is also possible to suppress peeling a via or wiring. Also, the three dimensional wiring structure is excellent in mechanical properties and electrical properties. Needless to say, since a wiring layer is formed inside the porous body so as to provide at least three layers, the wiring density can be increased and, thus, the three dimensional wiring structure of the present invention is adapted for a high density mounting. Further, the electromagnetic noise of the inside wiring layer can be markedly suppressed by using at least one layer, preferably the two surface layers or at least one layer other than surface layers as ground wiring.

It is absolutely necessary to employ the method of the present invention, in which a three dimensional exposure is employed and a plurality of porous films are laminated one upon the other, for manufacturing a multi-layered three dimensional wiring structure including at least three wiring layers.

A three dimensional structure according to a third embodiment of the present invention will now be described. The three dimensional structure according to the third embodiment of the present invention can be called a selective conductive member.

In the selective conductive member of the present invention, used is a porous structure having a continuous pore prepared by selectively removing at least one kind of phase selected from the micro phase separation structure exhibited by a block copolymer or a graft copolymer. The porous structure used in the present invention differs from a honeycomb-like sheet which has pores extending only one direction. More specifically, the porous structure has pores extending any directions in space. A conductive material is loaded in the pore within a predetermined region of the porous structure so as to form a conductive region or a wiring. The selective conductive member can be applied to, for example, an anisotropic conductive film, a printed circuit board or a multi-layered wiring board. It is reasonable to state that the porous structure in the selective conductive member of the present invention is constituted by at least one kind and not larger than (N–1) kinds of phases of the micro separation structure consisting of N kinds of phases.

The micro phase separation structure exhibited by a block copolymer or a graft copolymer is highly regular. It is possible to control the magnitude of the domain by the molecular weight of the copolymer. Particularly, a co-continuous structure among the micro phase separation phenomenon is a phase separation structure consisting of two phases continuous in a three dimensional direction. It is possible to form a porous structure having pores continuous in a three dimensional direction by selectively removing one of these two phases. Among such co-continuous structure, an OBDD structure and a Gyroid structure are particularly preferred. A three dimensional porous body manufactured from a co-continuous structure has continuous pores having a relative distance with respect to any of $2\sqrt{3}$ times and 4 times the radius of gyration of a cross section of the micro domain constituting a three dimensional porous structure. This can be confirmed by a small-angle X-ray scattering method or a light scattering method. Incidentally, to have a relative distance implies that, when a probability of presence of an ambient domain relative to a distance r from the center of a predetermined domain, i.e., a probability of a loading region at a point of distance r that the particular point is not a pore but forms a domain, is measured, there is a distance denoting the maximum of the probability of presence.

The method of selectively removing one phase from the micro phase separation structure is not particularly limited, and various methods can be employed including, for example, a method that, after coupling point is chemically cut by using a block copolymer or a graft copolymer comprising two terekeric polymer, one polymer chain is etched. It is also possible to employ the method of selectively ozone oxidizing one phase so as to decompose and remove the particular phase or the removing method by an oxygen plasma or a photolytic degradation. Further, it is also possible to selectively decompose and remove one phase by irradiation with an energy beam such as $\beta$-rays (electron beam) and so on.

The pore diameter of the resultant porous body can be controlled by the molecular weight of the polymer chain constituting the phase removed from the micro phase separation structure. Also, it is possible to control the pore diameter by mixing a homopolymer compatible with the polymer chain.

The polymer material for manufacturing a porous body from the phase separation structure is not particularly limited, and an optional polymer material can be used. Particularly, it is desirable to use a heat resistant polymer such as a polyimide, a polyamide, a polyaryl ether, a polyarylate or a polyether sulfone. It is also possible to use a crosslinked polymer prepared by crosslinking a polymer having a double bond in the side chain or backbone chain, said polymer being obtained by polymerizing a conjugated diene monomer such as 1,2-coupling type or 1,4-coupling type polybutadiene. Further, it is possible to use polycyclohexane or polynorbornene.

A porous body of a polyimide can be prepared as follows. In the first step, a polyamic acid, which is a precursor of polyimide, is mixed with a thermally decomposable polymer such as polyethylene oxide, polypropylene oxide or poly (methyl methacrylate). In this case, it is possible to carry out the phase separation as a block copolymer or a graft copolymer. Then, a heat treatment is applied so as to convert the polyamic acid into polyimide and, at the same time, to remove by evaporation the thermally decomposable polymer.

In view of the regularity of the structure, it is desirable to use a block copolymer or a graft copolymer. It should be noted, however, that, in the case of forming pores having a size of 100 nm or more, the molecular weight of the thermally decomposable polymer chain exceeds about 100, 000, making it somewhat difficult to synthesize a block copolymer. Therefore, it is desirable to obtain a graft copolymer by introducing a thermally decomposable polymer having a terminal coupling group as a graft chain to a polyimide or a polyamic acid.

To be more specific, in the case of synthesizing a graft copolymer between, for example, a polyamic acid and a thermally decomposable polymer such as polyethylene oxide or polypropylene oxide, the following technique can be employed. In the first step, an amino group or the like is introduced as a coupling group forming a chemical bond with a side chain of the polyamic acid such as a carboxylic group to the terminal of a thermally decomposable polymer chain. Then, the thermally decomposable polymer having the coupling group introduced thereinto is mixed with the polyamic acid so as to synthesize a graft copolymer.

It is also possible to control the pore diameter by adding a homopolymer to the block copolymer or graft copolymer. If a crosslinkable plasticizer such as bismaleimides are added in this step, formation of the micro phase separation structure is promoted and the heat resistance and mechanical strength of the porous body can be improved.

It should also be noted that a 1,2-coupling type polybutadiene, i.e., poly(vinylethylene) is crosslinked in a three dimensional direction by the addition of a radical generator or a crosslinking agent so as to provide a cured polymer excellent in heat resistance, electrical properties, humidity resistance and mechanical properties. In addition, since poly(vinylethylene) is capable of a living polymerization, it is possible to obtain a block copolymer having a high molecular weight and a uniform molecular weight distribution. It follows that, in the case of using a block copolymer between poly(vinylethylene) and a poly (methacrylic acid ester) that can be decomposed and removed by irradiation with β-ray or a thermally decomposable polyethyleneoxide or polypropyleneoxide, it is possible to form a regular porous body consisting of a crosslinked poly(vinylethylene) having a desired pore diameter. It is possible to control the pore diameter of the porous body by adding a homopolymer in this case, too.

The radical generating agent used in the present invention includes, for example, organic peroxides such as dicumyl peroxide and azonitriles such as azobis-isobutylonitrile. Particularly, it is desirable to use polyfunctional radical generating agents such as 2,2-bis(4,4-di-t-butyl peroxy cyclohexyl)propane, 3,3'4,4'-tetra(t-butyl peroxy carbonyl) benzophenone because the polyfunctional radical generating agent also acts as a crosslinking agent. It is desirable to add the radical generating agent in an amount of 0.1 to 20% by weight, more preferably 1 to 5% by weight, based on the polymer chain to be crosslinked. If the amount of the radical generating agent is unduly small, the density of crosslinkage is rendered low. On the other hand, if the amount of the radical generating agent is excessively large, the crosslinked material is rendered porous or the micro phase separation structure is disturbed.

It is desirable to use as the crosslinking agent bismaleimides such as bis(4-maleimide phenyl) methane, bis (4-maleimide phenyl) ether, 2,2'-bis[4-(para-aminophenoxy)phenyl]propane, and 2,2'-bis[4-(para-aminophenoxy)phenyl]hexafluoro propane. The addition amount should fall within a range of between 0.1 and 20% by weight, preferably between 1 and 5% by weight, based on the polymer chain to be crosslinked. If the addition amount of the crosslinking agent is unduly small, the density of the crosslinkage is low. If the addition amount is excessively large, however, the micro phase separation structure is disturbed.

If the crosslinking reaction proceeds before formation of the micro phase separation structure, the formation of the micro phase separation structure is impaired. Thus, it is desirable for the crosslinking reaction to be started after sufficient formation of the micro phase separation structure. Formation of the micro phase separation structure proceeds under temperatures higher than the glass transition temperature of each polymer chain forming a copolymer. Thus, it is desirable for the glass transition temperature of the polymer chain to be sufficiently lower than the radical generation temperature of the radical generating agent.

An example of the most preferred composition is a composition prepared by adding 2,2-bis(4,4-di-t-butyl peroxy cyclohexyl) propane or 3,3',4,4'-tetra(t-butyl peroxy carbonyl) benzophenone to a diblock copolymer or a triblock copolymer among poly(vinylethylene) chain and polyethylene oxide chain or polypropylene oxide chain in an amount of 1 to 5% by weight based on the poly (vinylethylene) chain. Particularly, it is most desirable to use 3,3',4,4'-tetra(t-butyl peroxy carbonyl) benzophenone as the radical generating agent.

Poly(vinylethylene) has a glass transition temperature of about 20° C. Also, polyethylene oxide or polypropylene oxide has a sufficiently low glass transition temperature of about 0° C. or lower. On the other hand, the thermal decomposition initiating temperatures of 2,2-bis(4,4-di-t-butyl peroxy cyclohexyl) propane and 3,3',4,4'-tetra(t-butyl peroxy carbonyl) benzophenone are 139° C. and 125° C., respectively, which are sufficiently high, when heated at a heating rate of 4° C./min. Therefore, it is desirable to form a micro phase separation structure by heating from room temperature to about 50° C., followed by gradually heating the composition to a temperature close to the thermal decomposition temperature of the radical generating agent so as to achieve crosslinking and curing. It should be noted, however, that, if the composition is heated to an unduly high temperature, the order-disorder transition temperature is exceeded before achieving a sufficient crosslinkage, resulting in melting to form a homogeneous composition. In this sense, 3,3',4,4'-tetra(t-butyl peroxy carbonyl) benzophenone is desirable because radicals are generated by irradiation with an ultraviolet ray without relying on the thermal decomposition.

As described above, 2,2-bis(4,4-di-t-butyl peroxy cyclohexyl) propane or 3,3',4,4'-tetra(t-butyl peroxy carbonyl) benzophenone is added to a diblock copolymer or a triblock copolymer among poly(vinyl ethylene) chain and poly(methyl methacrylate) chain in an amount of 1 to 5% by weight based on the poly(vinylethylene) chain. In this case, poly(methyl methacrylate) has a relatively high glass transition temperature of about 105° C. Thus, a crosslinking reaction is likely to take place before the micro phase separation structure is formed sufficiently. It follows that poly(methyl methacrylate), if irradiated with β-rays, tends to be thermally decomposed and evaporated, making it possible to form a porous structure by the washing with a solvent or by the heat treatment at a relatively low temperature. Since the glass transition temperature of poly(methyl methacrylate) is close to the cross linking initiating temperature of poly(methyl methacrylate), it is desirable to form the micro phase separation structure by slowly evaporating the solvent from the solution to form a cast film. In this case, formation of the micro phase separation structure is not impaired by the crosslinking if the evaporation of the solvent is performed at a temperature sufficiently lower than the thermal decomposition temperature of the radical generating agent. However, such a method of forming a cast film takes a relatively long time and, thus, the productivity is not sufficiently high. This is also the case with the use of poly(α-methyl styrene) in place of poly(methyl methacrylate).

In the case of using polymethacrylic acid esters in which an alkyl group having 3 to 6 carbon atoms is substituted or poly(α-methyl styrenes) in which such an alkyl group is substituted for the phenyl group in place of poly(methyl methacrylate) or poly(α-methyl styrene), the glass transition temperature is lowered, making it possible to avoid the above-noted problem. To be more specific, a micro phase separation structure can be formed promptly by applying a heat treatment to the copolymer film (or a molded body) at a temperature higher than the glass transition temperature. For example, poly(n-propyl methacrylate) and poly(n-butyl methacrylate) have low glass transition temperatures, i.e., 35° C. and 25° C., respectively. Poly(α-methyl styrene) having the 4-position butylated also exhibits a low glass transition temperature. The glass transition temperature can be further lowered if the alkyl group has at least 6 carbon atoms. However, at the same time, a crosslinking reaction tends to take place easily upon irradiation with β-rays. The polymers satisfying both the low glass transition temperature and the promotion of the decomposition by irradiation with β-rays include, for example, poly(n-propyl methacrylate), poly(n-butyl methacrylate) and poly(s-butyl methacrylate). Particularly, it is most desirable to use poly (n-butyl methacrylate) and poly(s-butyl methacrylate).

Where the alkyl group is branched like 2-ethyl hexyl group, the effect of promoting the decomposition by irradiation with β-rays is unlikely to be suppressed and, thus, it is desirable to use a branched alkyl group. However, the polymethacrylate having a branched alkyl group is inferior in the practical use to poly(n-butyl methacrylate) and poly (s-butyl methacrylate) because it is difficult to obtain monomers of polymethacrylate having a branched alkyl group.

It is also possible to use polyisobutylene and polypropylene in addition to the polymers described above as a polymer chain satisfying both the low glass transition temperature and the effect of promoting decomposition by irradiation with β-rays.

The irradiation amount of the β-rays, which is not particularly limited in the present invention, should fall within a range of between 100 Gy and 10 MGy, preferably between 1 KGy and 1 MGy, and most preferably between 10 KGy and 200 KGy. If the irradiation amount is unduly small, it is difficult to decompose sufficiently the decomposable polymer chain. On the other hand, if the irradiation amount is excessively large, the decomposed product of the decomposable polymer chain tends to be crosslinked in a three dimensional direction so as to be cured. Further, the polymer chain, which is unlikely to be decomposed, tends to be decomposed. The accelerating voltage, which is dependent on the thickness of the molded body of the copolymer, i.e., the penetration length of the β-rays into the molded body, should desirably fall within a range of between about 20 kV and 2 MV when it comes to a thin film having a thickness of about scores of $\mu$m or less and should desirably fall within a range of between about 500 kV and 10 MV when it comes to a molded body such as a film and bulk having a thickness of at least 100 $\mu$m. Where a metal molded body is contained in the molded body, it is possible to further increase the accelerating voltage.

In the case of employing the irradiation with β-rays, poly(vinylethylene) chain is crosslinked and, thus, it is possible to decrease the amount of the radical generating agent, or it is possible not to add at all the radical generating agent. In this case, it is not absolutely necessary to lower the glass transition temperature of the thermally decomposable polymer chain. Crosslinked poly(vinylethylene) exhibits excellent characteristics and, thus, it is attempted to use the crosslinked poly(vinylethylene) in a wiring board, though the crosslinked polymer is not satisfactory in the adhesivity to copper used as a wiring material. However, the difficulty can be avoided in the selective conductive member of the present invention because the wiring and the via consisting of copper is formed integral with the porous body in the present invention.

Particularly, the crosslinked polymer described previously, which is obtained by crosslinking a conjugated diene polymer such as poly(vinylethylene), is excellent in its heat resistance, electrical properties, humidity resistance and mechanical properties and, thus, is desirable.

In the porous structure manufactured from the micro phase separation structure, the pores are formed homogeneously and regularly, and the continuity of the pores is satisfactory. Also a residual stress is decreased. Thus, compared with the case of using a porous body prepared by conventional technique of elongation or the like, the dimensional stability is excellent and the conductance of the conductive region can be improved. Also, since it is possible to form pores of submicron order homogeneously, it is possible to form a fine wiring and a fine via. Further, since it is possible to make the width and thickness of the conductive region uniform, the impedance characteristics can also be improved.

In forming a conductive region in the porous body manufactured from the micro phase separation structure, it is possible to employ the technique similar to that in the case of manufacturing a three dimensional wiring structure described previously. It is possible to form a three dimensional wiring structure by the three dimensional exposure, and it is also possible to manufacture a multi-layered wiring structure by separately preparing a wiring sheet and a via sheet, followed by laminating these wiring sheet and via sheet. Also, it is possible to load a conductive paste or a conductive polymer by the technique of the screen printing in place of the plating. A sharp structure such as a sharp mountain-shaped structure of a Cu/Ni eutectic system can be employed in the end face exposed from the porous structure of the conductive region or the wiring as in the manufacture of a three dimensional wiring structure so as to achieve a good electrical connection.

In the porous body manufactured from the micro phase separation structure, the state of the inner surface of the pore can be controlled easily. To be more specific, in removing one phase of the micro phase separation structure, the particular phase is not removed completely and is allowed remain partly in the inner surface of the pore so as to change the surface state of the inner surface. For example, where a porous phase consisting of phase A is formed by removing phase C from a triblock copolymer of A-B-C in which the molecular weight of each of phases A and C is sufficiently larger than that of phase B, phase B is arranged on the inner surface of the pore. As a result, it is possible to change the properties of the inner surface of the pore without markedly changing the properties of the porous body as a whole. It follows that it is possible to improve the adsorption characteristics of the plating nucleus in performing a positionally selective electroless plating. Further, it is possible to improve the adhesivity between the impregnated resin and the porous body. In this case, since phase B is completely bonded with phase A by a chemical bonding, the relationship between phases A and B is superior in adhesivity to the surface treating agent of the ordinary surface adsorption type.

It should also be noted that, in the case of using a sheet in which is formed a co-continuous phase separation structure having one phase consisting of a phase that is decomposed by irradiation with an energy beam such as an ultraviolet ray or β-rays, the patterning can be performed easily. The decomposable phase includes, for example, poly(α-styrenes) and polyolefins having a methyl group substituted in the α-position like poly(methacrylic acid esters) such as poly(methyl methacrylate).

In forming a selective conductive member, the particular sheet is irradiated with an ultraviolet ray or β-rays in a pattern of vias so as to decompose the decomposable phase of the irradiated portion. After the decomposition, the decomposed phase is removed by evaporation performed by heating and by etching with a solvent so as to provide a porous structure. A via or a wiring can be formed by loading a conductive material such as a metal in the porous portion by applying, for example, an electroforming or an electroless plating.

The selective conductive member of the present invention can be applied to a double-printed board. FIGS. 7A to 7D are cross sectional views collectively exemplifying a method of manufacturing a double-printed board consisting of a selective conductive member of the present invention.

In the first step, a predetermined region of a micro phase separation film 22 is selectively made porous to form a porous portion 23, as shown in FIG. 7A. The technique described above can be employed for forming the porous portion 23. Then, a conductive region 24 is formed by loading a conductive material in the porous portion 23, as shown in FIG. 7B. Further, conductive layers 25 are formed on both surfaces of the micro phase separation film, as shown in FIG. 7C, followed by patterning the conductive films to form wiring patterns 26 on both surfaces, as shown in FIG. 7D, thereby obtaining a double-printed board 27.

It is also possible to form an interlayer wiring of a multi-layered chip of a semiconductor. To be more specific, it is possible to form an interlayer wiring for laminating semiconductor chips each having pads on the upper and lower portions. For example, a columnar wiring aligned with the position of the pad of the semiconductor chip or a columnar wiring arranged without aligning the position of the pad of the semiconductor chip is formed in a thickness direction of the porous sheet. A wiring between two adjacent semiconductor chips can be formed by inserting the porous sheet body having a columnar wiring thus formed therein between two semiconductor chips, followed by laminating the resultant three layer structure. It is also possible to remove the porous body sheet by oxygen ashing or thermal decomposition. Further, after removal of the porous body sheet, the porous wiring can be made dense by applying, for example, an electrolytic plating or an electroless plating.

In the embodiment described above, an additive technique in which a metal is precipitated by, for example, a plating is employed for forming a wiring or a via within the porous body sheet. However, the present invention is not limited to the particular technique. For example, a wiring or a via can be formed within the porous body sheet by a subtractive technique. In this case, a metal is loaded in advance in the porous body sheet, followed by removing the undesired portion of the metal by etching using a resist pattern.

Also, it is possible to form a wiring board having a via or a wiring formed in the cured material of the impregnated resin. For forming such a wiring board, used is a porous body that can be removed easily by, for example, a thermal decomposition, and a conductive material is loaded in a predetermined region so as to form a via or a wiring. Then, before the impregnated resin is cured, the porous body is removed so as to form a wiring board having a via or a wiring formed in the cured material of the impregnated resin. When the impregnated resin is cured, the porous body is compressed under pressure. As a result, the void formed in the conductive region by the removal of the porous body is collapsed so as to permit the conductive materials to be bonded to each other so as to improve the conductance of the conductive region.

Further, in the case of using a porous body in which the inner surface of the pore is coated in advance with an adhesive such as a thermosetting resin, it is possible to prevent the difficulty that the end face of the via is covered with the impregnated resin at the time of lamination so as to impair the electrical connection.

It is possible to form a structure consisting of a metal oxide, carbon or diamond within the porous body by the technique similar to that for forming a via or a wiring described above. In this case, it is possible to form a capacitor, a resistor and a semiconductor portion simultaneously in the circuit. Also, it is possible to use a conductive material other than a metal. For example, a conductive polymer can also be used as a conductive material for forming a via or a wiring.

It is possible to form a photonic crystal that can be applied to various devices having an optical function by employing the method of the present invention for forming a three dimensional structure. It is also possible to manufacture easily and with a high performance a multi-layered wiring board or an interposer indispensable for a high density mounting to a portable equipment or a microphone and for mounting of a spherical semiconductor, a multi-layered wiring or a three dimensional writing suitably used in a steric wiring.

The present invention will now be described in detail with reference to Examples. Needless to say, the present invention is not limited to the following Examples.

EXAMPLE 1

Prepared was propyleneglycol methyl ether acetate (PGMA) solution of diblock copolymer (Mw=75,000, polystyrene unit weight fraction=66%, Mw/Mn=1.10) of polystyrene (PS)-poly(methyl methacrylate) (PMMA).

A sheet having a thickness of 150 μm was prepared from the solution by a casting method. The resultant sheet was subjected to air-drying at 70° C., followed by annealing at 135° C. for 10 hours under a nitrogen gas stream. Then, the sheet was irradiated with β-rays under an accelerating voltage of 2 MV and with a dose of 160 KGy. After the irradiation, the sheet was washed within a mixed solvent of MIBK-isopropyl alcohol (volume ratio 3:7) so as to obtain a porous body sheet. The porous body sheet thus obtained was of a porous structure having a bi-continuous type phase separation structure with an aperture of 35 nm transferred thereonto.

On the other hand, prepared was a photosensitive composition by adding 0.1% by weight of a photo initiator 2 having a chemical formula given below to a mixture of styrene and a tetrafunctional acrylate monomer 1 having a chemical formula given below, the mixing ratio of styrene to tetrafunctional acrylate monomer 1 being 9:1, followed by impregnating the porous body sheet with the photosensitive composition thus prepared:

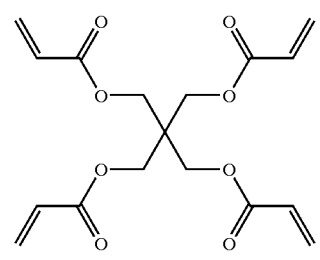

tetrafunctional acrylate monomer 1

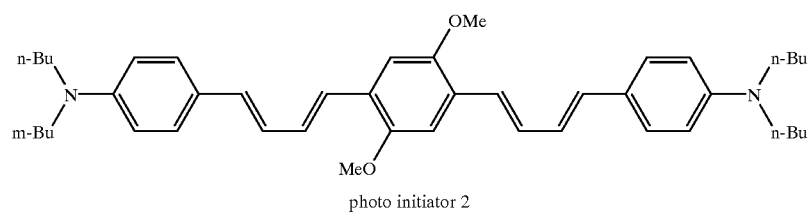

photo initiator 2

Then, a three dimensional exposure was applied to the porous body sheet impregnated with the photosensitive resin composition as follows. Specifically, used as a source was Ti: Sapphire laser (pulse width: 150 fs; repetition: 76 MHz; spot diameter: 0.4 μm). The three dimensional exposure was performed by moving the porous body sheet such that the focus of the laser beam is scanned within the porous body sheet. After the exposure, the porous body sheet was dipped in isopropyl alcohol so as to remove the uncured styrene and acrylate monomer 1.

As a result, obtained was a three dimensional structure providing a photonic crystal of the construction in which a body-centered cubic lattice having a side of 1.2 μm is formed by balls having a diameter of 0.6 μm in the exposed portion within the porous body sheet.

The refractive indexes in the exposed portion and the non-exposed portion in the resultant three dimensional structure were found to be 1.58 and 1.24, respectively.

EXAMPLE 2

Prepared was a photosensitive resin composition by adding 0.1% by weight of the photo initiator 2 equal to that used in Example 1 to a mixture consisting of the tetrafunctional acrylate monomer 1 equal to that used in Example 1, a methacrylate monomer 3 having a chemical structure given below, and styrene, and mixed at a mixing ratio by weight of 0.5:0.5:9. A three dimensional structure providing a photonic crystal was prepared as in Example 1, except that used in Example 2 was the photosensitive resin composition described above.

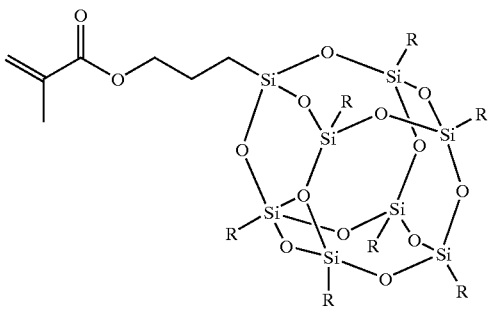

methacrylate monomer 3

(R Represents n-propyl Group)

The refractive indexes in the exposed portion and the non-exposed portion in the resultant three dimensional structure were found to be 1.57 and 1.24, respectively.

EXAMPLE 3

A silica aerogel porous body was used as a porous body having through holes continuous in a three dimensional direction. The porous body had an average pore diameter of about 30 nm, a porosity not lower than 95%, a refractive index of 1.03 and a size of 1 mm×1 mm×1 mm.

The porous body was impregnated with a photosensitive resin composition prepared by adding 0.1% by weight of photo initiator 2 to a mixture comprising methyl methacrylate and tetrafunctional acrylate monomer 1 equal to that used in Example 1, the mixing ratio being 8:2. The porous body thus impregnated with the photosensitive resin composition was disposed on a piezoelectric element driving stage that can be driven in the direction of XYZ axes, and a three dimensional exposure was applied to the porous body as follows. Specifically, used as the source was Ti: Sapphire laser (pulse width: 150 fs; repetition: 76 MHz; spot diameter: 0.4 μm). The three dimensional exposure was performed by moving the porous body such that the focus of the laser beam is scanned within the porous body.

After the exposure, the porous body was dipped in isopropyl alcohol so as to remove the uncured acrylate monomer 1.

As a result, obtained was a three dimensional structure providing a photonic crystal of the construction in which a body-centered cubic lattice having a side of 1.2 μm is formed by balls having a diameter of 0.6 μm in the exposed portion within the porous body sheet.

The refractive indexes in the exposed portion and the non-exposed portion in the resultant three dimensional structure were found to be 1.03 and 1.45, respectively.

Also, an impregnating resin was prepared by adding 2 parts by weight of azo-isobutyronitrile and 1 part by weight of Rhodamine 6G to 100 parts by weight of methyl methacrylate, and the porous body in which the three dimensional structure was formed was impregnated with the impregnating resin thus prepared, followed by curing the impregnated resin by heating. As a result, formed was a photonic crystal filled with Rhodamine 6G except the spherical portion forming the body-centered cubic lattice.

Further, it was possible to impregnate the porous body with E-7 (trade name of a liquid crystal manufactured by Merc Inc.) in place of the resin containing Rhodamine 6G.

It was also possible to form a core, having a diameter of 5 μm, of an optical waveguide forming an incident portion to the photonic crystal by the technique similar to that employed for manufacturing the photonic crystal.

Further, the region forming the body-centered cubic lattice was exposed, followed by further applying a three dimensional exposure so as to form regions contiguous in one dimensional direction. After the exposure, the porous body was dipped in isopropyl alcohol so as to remove the uncured acrylate monomer 1. As a result, obtained was a three dimensional structure formed in the porous body. The three dimensional structure was formed such that an optical waveguide having balls 1 μm in diameter arranged in a one dimensional direction was formed in a structure in which balls each having a diameter of 0.6 μm formed a body-centered cubic lattice having a side of 1.2 μm. The balls each having a diameter of 1 μm were arranged with the distance between the centers of the adjacent balls set at 0.8 μm.

EXAMPLE 4

Double Printed Wiring Board

Prepared was a mixed solution comprising polyamic acid 4 represented by the chemical formula given below and terminal dimethylamino ethyl ether group polyethylene oxide (molecular weight Mw=21,000; Mw/Mn=1.2):

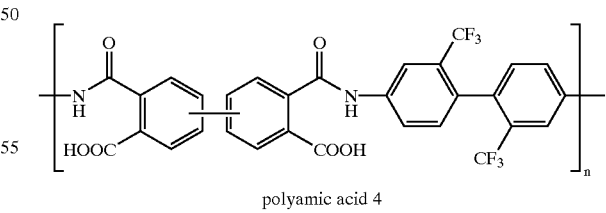

polyamic acid 4

A sheet was prepared from the solution by a casting method. The sheet thus prepared was heated from room temperature to 150° C. over 30 minutes under a nitrogen gas stream. The sheet was kept heated at 150° C. for one hour. Then, the sheet was heated to 250° C. over 30 minutes and kept heated at 250° C. for one hour. Further, the sheet was heated to 350° C. over 30 minutes and kept heated at 350° C. for one hour. As a result, obtained was a polyimide porous body sheet having a thickness of 30 μm.

The sheet after the heat treatment was observed with a transmitting electron microscope. It has been found that a bi-continuous type micro phase separation structure was transferred to the sheet. And the sheet was a porous structure having pores having a pore diameter of 0.2 μm and formed continuous in a three dimensional direction.

The resultant porous body sheet was impregnated with "Photoneeth UR-3140" (trade name of a photosensitive polyimide manufactured by Toray Inc.), followed by bonding a copper foil having a thickness of 18 μm to the lower surface of the porous body sheet. After the pattern of a via portion was exposed from the upper surface (on the side of the porous body sheet), the exposed portion was developed to make the via portion porous. Copper was loaded by an electrolytic plating in the porous via portion so as to form a via. Further, after a solder plating was applied to the upper end of the via, the upper surface except the via portion was coated with an epoxy resin by an ink jet method, followed by arranging a copper foil on the upper surface of a copper foil having a thickness of 18 μm. Then, the resultant structure was pressurized under heating by using a thermal pressing device, thereby obtaining a laminate body.

In the next step, the copper foils on both surfaces were patterned by an ordinary PEP process so as to obtain a double printed wiring board having an ordinary IVH for an interlayer conduction formed inside. The diameter of the via in the double printed wiring board was found to be 50 μm. Also, the wiring width was found to be 50 μm.

EXAMPLE 5
Double Printed Wiring Board

A polyimide porous body sheet having a thickness of 10 μm was obtained by the technique similar to that in Example 4. It has been found that a bi-continuous type micro phase separation structure was transferred to the polyimide porous sheet. And the sheet was a porous structure having pores having a pore diameter of 0.2 μm and formed continuous in a three dimensional direction.

The resultant porous body sheet was impregnated with "Photoneeth UR-3140" (trade name of a photosensitive polyimide manufactured by Toray Inc.), followed by drying the porous body sheet and subsequently protecting the upper surface with a protective film. Then, a copper foil having a thickness of 1 μm was formed on the lower surface by an electroless plating and an electrolytic plating, which were carried out in succession. After the pattern of a via portion was exposed from the upper surface (on the side of the porous body sheet), the exposed portion was developed to make the via portion porous. Then, copper was loaded by an electrolytic plating in the porous via portion so as to form a via.

Further, a copper layer having a thickness of 1 μm was formed on the upper surface as on the lower surface. Finally, the copper foils on both surfaces were patterned by an ordinary PEP process so as to obtain a double printed wiring board having an ordinary IVH for an interlayer conduction formed inside.

The resultant porous body sheet was impregnated with "Photoneeth UR-3140" (trade name of a photosensitive polyimide manufactured by Toray Inc.), followed by drying the porous body sheet. Then, the pattern of a via portion was exposed from the upper surface (on the side of the porous body sheet), followed by developing the exposed portion to make the via portion porous. Copper was loaded by an electroless plating in the porous via portion so as to form a via, and a solder plating was applied to the end face of the via. Further, the both surfaces except the via portions were coated with an epoxy resin by an ink jet method so as to obtain a via sheet.

The double printed wiring board prepared in advance was interposed between two via sheets thus prepared. The resultant structure of the sheet members was aligned and, then, pressurized under heat by using a thermal pressing device so as to form a laminate structure. After the lamination process, a copper plating was applied to each of the both surfaces so as to form a copper layer having a thickness of 1 μm on each surface.

A wiring pattern was formed in the copper layer by an ordinary PEP process so as to obtain a multi-layered wiring board having four layers of circuit wirings. Two multi-layered wiring boards each having four layers of circuit wirings were bonded to each other by the similar process so as to obtain a multi-layered wiring board having 10 layers. The diameter of the via in the multi-layered wiring board was found to be 10 μm. On the other hand, the wiring width was found to be 5 μm.

EXAMPLE 6
Formation of Multi-layered Wiring by Collective Electroless Plating A PTFE porous body sheet having a thickness of 20 μm, an average pore diameter of 0.2 μm and a porosity of 72% was dipped in methanol for 10 minutes and, then, in water for 10 minutes, followed by impregnating the porous body sheet with a 4 wt % aqueous solution of boric acid. The PTFE porous body sheet was irradiated through a mask of a circuit pattern with an ArF laser beam (energy density: 200 mJ/cm$^2$; repetition: 50 pulses/sec) so as to make the porous body sheet hydrophilic selectively to conform with the circuit pattern. After the irradiation, the porous body sheet was washed with a pure water and, then, dried so as to obtain a sheet having the wiring pattern exposed.

A porous body sheet having a via pattern exposed was formed by the technique equal to that described above, except that the via pattern was exposed.

A sheet having a wiring pattern exposed and another sheet having a via pattern exposed were aligned and laminated one upon the other, followed by dipping the laminate structure in an electroless plating bath of copper. As a result, copper was precipitated in a portion that was made hydrophilic so as to form a circuit wiring having a pattern wiring width of 20 μm and a via diameter of 20 μm. After formation of the wiring pattern, an oxygen plasma treatment was applied so as to make the entire system hydrophilic.

Finally, the laminated body was impregnated with an epoxy resin and pressurized under heat by using a thermal pressing device so as to cure the epoxy resin and make the laminated body integral, thereby obtaining a multi-layered wiring board having three wiring layers. The diameter of the via in the multi-layered wiring board was found to be 20 μm. Also, the wiring width was found to be 20 μm.

EXAMPLE 7
Formation of Three Dimensional Wiring by Three Dimensional Exposure A sheet was prepared by a casting method from a mixed solution similar to that used in Example 4. The resultant sheet was heated from room temperature to 70° C. over one hour under a nitrogen gas stream and kept heated at 70° C. for 5 hours. Then, the sheet was heated to 150° C. over 5 hours, and kept heated at 150° C. for 5 hours, followed by heating the sheet to 250° C. over one hours. After the sheet was kept heated at 250° C. for 2 hours, the sheet was further heated to 350° C. over 30 minutes and kept heated at 350° C. for one hour. As a result, obtained was a polyimide porous body sheet having a thickness of 500 μm.

The film after the heat treatment was observed with a transmitting electron microscope. It has been found that a bi-continuous type micro phase separation structure was transferred to the sheet. And the sheet was a porous structure having pores having a pore diameter of 0.2 μm and formed continuous in a three dimensional direction.

The polyimide porous body sheet thus obtained was made hydrophilic by the treatment with an oxygen plasma, followed by dipping the sheet in a methanol solution of cetyl pyridinium complex of palladium ($[C_{16}H_{33}C_5H_5N]^{2+}[PdI_4]^{2-}$), followed by drying the porous body sheet.

A three dimensional exposure was applied to the porous body sheet after the drying as follows. Specifically, the porous body sheet was irradiated with a colorant laser beam of $Nd^{3+}$:YAG second harmonic component excitation having a wavelength of 420 nm, a pulse width of 10 nsec, a repetition of 10 Hz, and a spot diameter of 10 µm, followed by scanning the spot within the porous body so as to achieve a three dimensional exposure. Then, the porous body sheet was washed with methanol to remove the Pd complex in the non-exposed portion, followed by dipping the porous body in an electroless plating bath of copper. As a result, copper was precipitated in the exposed portion so as to form a copper wiring having a wiring width of 20 µm in a three dimensional direction to conform with the scanning manner of the laser spot.

EXAMPLE 8

A solution was prepared by mixing 2 parts by weight of 3,3'-4,4'-tetra(t-butyl peroxycarbonyl) benzophenone with a diblock copolymer (Mw=287,000; polybutadiene unit weight fraction=32%; Mw/Mn=1.05) between poly-1,2-butadiene (poly(vinylethylene)) and poly(methyl methacrylate). A sheet having a thickness of 500 µm was prepared from the resultant solution by a casting method.

The sheet thus prepared was subjected to a heat treatment at 135° C. for 2 hours under a nitrogen gas stream, followed by irradiating the sheet with β-rays under an accelerating voltage of 2 MV and at a dose of 160 KGy. The sheet after the irradiation was washed with an ethyl lactate so as to obtain a porous body sheet.

The resultant porous body sheet was of a porous structure onto which a bi-continuous phase separation structure having a pore diameter of about 50 nm was transferred.

A three dimensional wiring structure was formed by applying an exposure and plating to the porous body sheet as in Example 7 except the use of the porous body sheet.

The polybutadiene porous body sheet having a three dimensional wiring structure formed therein was impregnated with the impregnating resin given below, followed by applying a heat treatment to the porous body sheet at a predetermined temperature so as to cure the impregnating resin and, thus, to obtain a multi-layered wiring board.

(1) An impregnating resin was prepared by mixing 2,2'-bis[4-(para-aminophenoxy)phenyl]hexafluoro propane, methacrylate monomer 3 and dicumyl peroxide by a weight ratio of 100:10:3. Methacrylate monomer 3 used herein is the same compound as used in Example 2.

The polybutadiene porous body sheet having the three dimensional structure formed therein was impregnated with the impregnating resin thus prepared, followed by applying a heat treatment to the impregnated porous body sheet at 170° C. for 30 minutes so as to obtain a multi-layered wiring board.

(2) A multi-layered wiring board was prepared as in item (1) above, except that used as the impregnating resin was a mixture prepared by adding 5 parts by weight of dicumyl peroxide to poly-1,2-butadiene (poly(vinylethylene)) (Mw=120,000; Mw/Mn=1.06).

(3) A multi-layered wiring board was prepared as in item (1) above, except that used as the impregnating resin was a benzocyclobutene resin solution (trade name: cyclotene, manufactured by Dow Chemical Inc.), and after impregnated with the resin solution, the porous body sheet was dried with hot air, followed by curing the impregnated resin by heating at 220° C. for one hour under a nitrogen gas stream.

(4) Poly(1,2-dimethyl silazane) was used as the impregnating resin. Further, in this case, the porous body sheet was also changed as follows. Specifically, a porous body sheet having a three dimensional wiring formed therein was obtained as in item (1), except that used was a modified diblock copolymer prepared by substituting triethoxy silyl ethyl group for the vinyl group of diblock copolymer of poly-1,2-butadiene-poly(methyl methacrylate) (Mw=287,000; polybutadiene unit weight fraction=32%; Mw/Mn=1.05; substitution rate: about 20%) in place of diblock copolymer of poly-1,2-butadiene-poly(methyl methacrylate).

The porous body sheet was impregnated with the impregnating resin noted above and heated under the same conditions as described above so as to cure the impregnated resin and, thus, to obtain a multi-layered wiring board.

In each of the multi-layered wiring boards thus prepared, the via diameter was 20 µm and the wiring width was also 20 µm. A heat treatment was applied to the multi-layered wiring board at 300° C. for 300 seconds. No abnormality was recognized. Also, the multi-layered wiring board was found to exhibit a sufficient resistance to the heat in the soldering step.

EXAMPLE 9

A solution was prepared by mixing 5 parts by weight of 3,3'-4,4'-tetra(t-butyl peroxycarbonyl) benzophenone with diblock copolymer (Mw=290,000; polybutadiene unit weight fraction=31%; Mw/Mn=1.03) between poly-1,2-butadiene and poly(s-butyl methacrylate). Then, a sheet having a thickness of 50 µm was prepared from the solution by a curtain coating method.

The sheet thus prepared was subjected to a heat treatment at 60° C. for 5 hours under a nitrogen gas stream, followed by irradiating the sheet with an ultraviolet ray using a low pressure mercury lamp as a source. After irradiation with the ultraviolet ray, the sheet was kept heated at 60° C. for one hour, followed by heating the sheet to 170° C. over 30 minutes. Then, the sheet was kept heated at 170° C. for 30 minutes. After the heat treatment, the sheet was irradiated with β-rays under an accelerating voltage of 2 MV and at a dose of 160 KGy. The sheet after the irradiation was washed with ethyl lactate so as to obtain a porous body sheet.

The porous body sheet thus obtained was found to be of a porous structure having a co-continuous phase separation structure having a pore diameter of about 50 nm transferred thereonto. Also, the micro phase separation structure was obtained by a heat treatment without relying on a casting method.

The porous body sheet was dipped in a methanol solution of cetyl pyridinium complxes of palladium ($[C_{16}H_{35}C_5H_5N]^{2+}[PdI_4]^{2-}$), followed by drying the porous sheet. After drying, the porous body sheet was irradiated with a colorant laser beam excited by $Nd^{3+}$:YAG second harmonic component (wavelength: 420 nm; pulse width: 10 nsec; repetition: 10 Hz; spot diameter: 10 µm) as a source in a dot-like two dimensional pattern. Then, the porous body sheet was washed with methanol so as to remove the Pd complex in the non-exposed portion, followed by dipping the porous body sheet in an electroless plating bath of copper. As a result, copper was precipitated in the exposed portion of the porous body film so as to form copper columns extending through the porous body film, having a dot diameter of 20 µm, and arranged to form a two dimensional pattern with the distance between the centers of the adjacent copper columns set at 40 µm.

The end face of the copper column thus formed was plated with a Cu/Ni eutectic to form a sharp mountain-like structure having a height of 2 to 3 µm. A resin composition that was to be impregnated in the porous body sheet having the copper columns formed therein was prepared as follows.

Specifically, an impregnating solution was prepared by adding 30% by weight of 2,2-bis[4-(4-maleimide phenoxy) phenyl to a polyamic acid varnish prepared by the reaction between one equivalent of 3,3'-4,4'-benzophenone tetracarboxylic acid dianhydride and one equivalent of 2,2'-bis-[4-(para-aminophenoxy)phenyl]propane in dimethyl acetoamide.

The porous body sheet having the copper columns formed therein was impregnated with the impregnating solution noted above, followed by removing the solvent by the drying with hot air. Then, the impregnated sheet was heated at 200° C. for 30 minutes so as to manufacture an adhesive anisotropic conductive film.

EXAMPLE 10

A porous body sheet having a thickness of 20 μm was prepared as in Example 9. Also prepared were a wiring sheet in which a wiring consisting of a two dimensional pattern having a wiring width of 20 μm and a land diameter of 50 μm was formed by the laser irradiation and the electroless plating as in Example 9, and a via sheet having vias each having a via diameter of 20 μm formed therein. The end face of the via in the via sheet was of a sharp mountain-like structure as in Example 9. Four wiring sheets and three via sheets were alternately laminated one upon the other and the resultant laminate structure was compressed, followed by impregnating the laminate structure with a resin solution cyclotene (trade name of a benzocyclobutene resin solution prepared by Dow Chemical Inc.). After removing the solvent by drying with hot air, the laminate structure was cured by heating at 240° C. for one hour under a nitrogen gas stream so as to obtain a multi-layered wiring board.

As described above in detail, the present invention provides a three dimensional structure consisting of a photonic crystal having two regions widely differing from each other in the refractive index. The present invention also provides a three dimensional structure as a three dimensional wiring structure adapted for a multi-layered wiring board or a steric wiring board having a high degree of freedom in the circuit design and consisting of fine wiring, and also provides a three dimensional structure as a selective conductive member having fine wirings and vias and excellent in impedance characteristics. Further, the present invention provides a method of manufacturing such a three dimensional structure.

The technical idea of the present invention can be suitably used in various fields such as various light functioning devices and multi-layered wiring boards, leading to a very high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A three dimensional structure, comprising:
a porous body the diameter of said pores of the porous body falling within a range of between 30 nm to 2000 nm; and
a three dimensional wiring pattern formed by a conductive material infiltrated into the porous body;
wherein said three dimensional wiring pattern includes at least three first layers each having a two dimensional wiring pattern and arranged in a direction perpendicular to the plane of the two dimensional wiring pattern, and at least two second layers interposed between two adjacent first layers and having joining portions for joining the two dimensional wiring pattern of the first wiring layer interposed between these two second layers.

2. The three dimensional structure according to claim 1, wherein said porous body is formed of a micro phase separation structure.

3. The three dimensional structure according to claim 1, wherein said porous body has a porosity of at least 40%.

4. The three dimensional structure according to claim 1, wherein the end face of said joining portion in contact with said two dimensional wiring pattern has an acute angle structure.

5. The three dimensional structure according to claim 1, wherein the end face of said joining portion in contact with said two dimensional wiring pattern has at least one metal selected from the group consisting of gold, silver and platinum.

6. The three dimensional structure according to claim 1, wherein the pore diameter of said porous body falls within a range of between 50 nm and 1000 nm.

7. The three dimensional structure according to claim 1, wherein the pore diameter of said porous body falls within a range of between 100 nm and 500 nm.

8. A three dimensional structure, comprising:
a sheet-like first porous body having a two dimensional wiring pattern infiltrated into said sheet-like first porous body; and
a sheet-like second porous body laminated on and made integral with said first porous body;
wherein said second porous body has a joining portion connected to the two dimensional wiring pattern infiltrated into said first porous body, said joining portion comprising conductive material infiltrated into said sheet-like second porous body,
the pores of the first and second porous bodies are through-holes, and
the pore diameter of said porous body falls within a range of between 30 nm and 2000 nm.

9. The three dimensional structure according to claim 8, wherein each of said first and second porous bodies is formed of a micro phase separation structure.

10. The three dimensional structure according to claim 8, wherein said porous body has a porosity of at least 40%.

11. The three dimensional structure according to claim 8, wherein the end face of said joining portion in contact with said two dimensional wiring pattern has an acute angle structure.

12. The three dimensional structure according to claim 8, wherein the end face of said joining portion in contact with said two dimensional wiring pattern has at least one metal selected from the group consisting of gold, silver and platinum.

13. A method of manufacturing a three dimensional wiring pattern, comprising the steps of:
selectively exposing a porous body to beam in a three dimensional wiring pattern having a plurality of two dimensional patterns in the incident direction of the beam; and
selectively infiltrating a conductive material or a precursor thereof into the exposed portion or non-exposed portion of the porous body after the exposure.

14. A three dimensional structure, comprising:
a porous structure and a conductive region formed by loading a conductive material in pores of a predetermined region of the porous body,
wherein said porous body is formed by removing at least one kind of the phase constituting a micro phase separation structure, and wherein said porous body has continuous pores having a relative distance with respect to any of $\sqrt{2}\sqrt{3}$ times and 4 times the radius of gyration of a cross section of the micro domain constituting the porous structure.

15. The three dimensional structure according to claim 14, wherein said micro phase separation structure is a micro phase separation structure exhibited by a block copolymer or a graft copolymer.

16. The three dimensional structure according to claim 14, wherein said micro phase separation structure is formed of a polymer material prepared by crosslinking poly (vinylethylene).

17. The three dimensional structure according to claim 14, wherein said porous body has a porosity of at least 40%.

18. The three dimensional structure according to claim 14, wherein the pore diameter of said porous body falls within a range of between 30 nm and 200 nm.

19. The three dimensional structure according to claim 14, wherein said micro phase separation structure is an ordered bicontinuous double diamond structure or a Gyroid structure.

* * * * *